United States Patent
Bittner et al.

(10) Patent No.: US 9,348,234 B2
(45) Date of Patent: May 24, 2016

(54) MICROLITHOGRAPHIC APPARATUS

(71) Applicant: Carl Zeiss SMT GmbH, Oberkochen (DE)

(72) Inventors: Boris Bittner, Roth (DE); Norbert Wabra, Werneck (DE); Sonja Schneider, Oberkochen (DE); Ricarda Schoemer, Zusmarshausen (DE); Martin von Hodenberg, Oberkochen (DE); Hendrik Wagner, Aalen (DE); Rumen Iliew, Oberkochen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days.

(21) Appl. No.: 14/845,574

(22) Filed: Sep. 4, 2015

(65) Prior Publication Data

US 2016/0011521 A1    Jan. 14, 2016

Related U.S. Application Data

(63) Continuation of application No. PCT/EP2013/000728, filed on Mar. 13, 2013.

(51) Int. Cl.
*G03B 27/54* (2006.01)
*G03B 27/42* (2006.01)
*G03F 7/20* (2006.01)

(52) U.S. Cl.
CPC ............ *G03F 7/70191* (2013.01); *G03F 7/702* (2013.01); *G03F 7/70891* (2013.01)

(58) Field of Classification Search
CPC .................... G03F 7/70891; G03F 7/70191
USPC ......................... 355/53, 55, 67–71
See application file for complete search history.

(56) References Cited

U.S. PATENT DOCUMENTS

| 5,986,795 A | 11/1999 | Chapman et al. |
| 6,338,823 B1 | 1/2002 | Furukawa |

(Continued)

FOREIGN PATENT DOCUMENTS

| EP | 0 532 236 A1 | 3/1993 |
| EP | 1 528 646 | 5/2005 |

(Continued)

OTHER PUBLICATIONS

International Search Report for International Patent Application PCT/EP2013/000728 dated Dec. 4, 2013.

*Primary Examiner* — Hung Henry Nguyen
(74) *Attorney, Agent, or Firm* — Fish & Richardson P.C.

(57) ABSTRACT

A projection objective of a microlithographic projection apparatus has a wavefront correction device (42) comprising a mirror substrate (44; 44a, 44b) that has two opposite optical surfaces (46, 48), through which projection light passes, and a circumferential rim surface (50) extending between the two optical surfaces (46, 48). A first and a second optical system (OS1, OS2) are configured to direct first and second heating light (HL1, HL2) to different portions of the rim surface (50) such that at least a portion of the first and second heating light enters the mirror substrate (44; 44a, 44b). A temperature distribution caused by a partial absorption of the heating light (HL1, HL2) results in a refractive index distribution inside the mirror substrate (44; 44a, 44b) that corrects a wavefront error. At least the first optical system (OS1) comprises a focusing optical element (55) that focuses the first heating light in a focal area (56) such that the first heating light emerging from the focal area (56) impinges on the rim surface (50).

22 Claims, 14 Drawing Sheets

(56) References Cited

U.S. PATENT DOCUMENTS

| | | |
|---|---|---|
| 6,504,597 B2 | 1/2003 | Schuster et al. |
| 6,897,940 B2 | 5/2005 | Sogard |
| 7,830,611 B2 | 11/2010 | Conradi et al. |
| 2004/0008433 A1* | 1/2004 | Margeson ............... G02B 26/06 359/871 |
| 2008/0204682 A1 | 8/2008 | Uehara et al. |
| 2008/0212045 A1 | 9/2008 | Bader |
| 2009/0257032 A1 | 10/2009 | Eva et al. |
| 2010/0201958 A1 | 8/2010 | Hauf et al. |
| 2010/0290020 A1 | 11/2010 | Mori |

FOREIGN PATENT DOCUMENTS

| | | |
|---|---|---|
| WO | WO 2004/092843 A2 | 10/2004 |
| WO | WO 2012/013746 | 2/2012 |

* cited by examiner

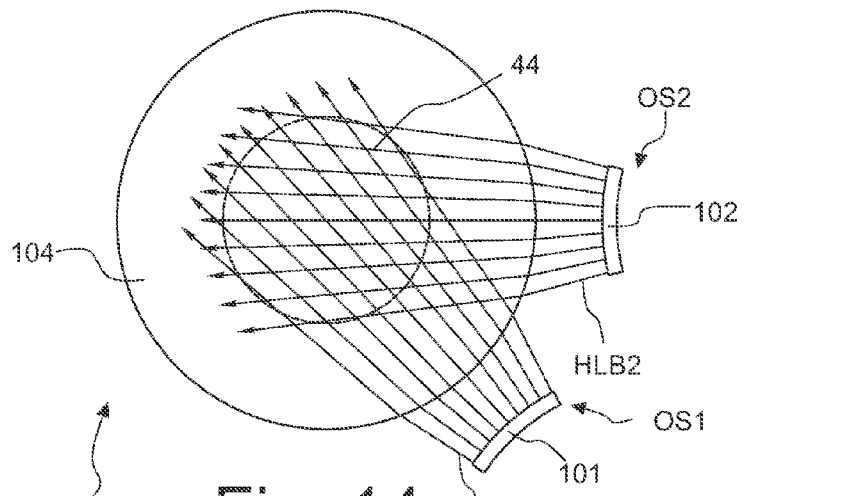
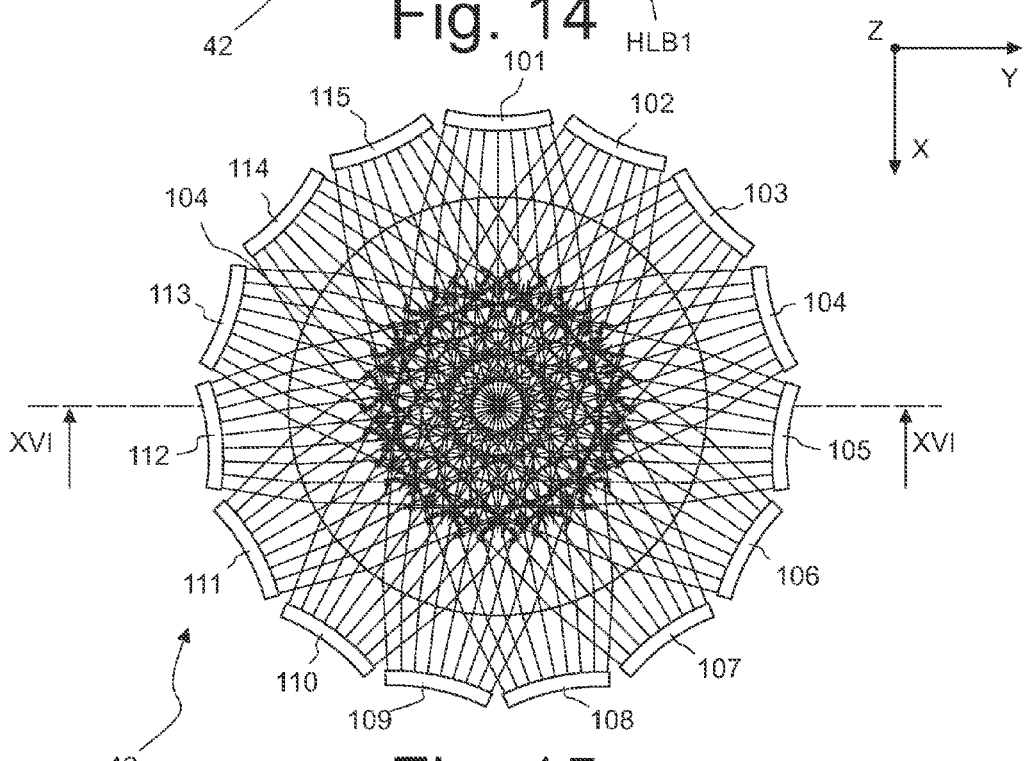
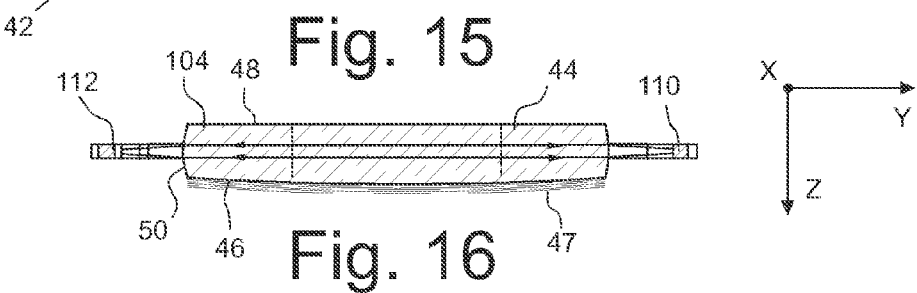

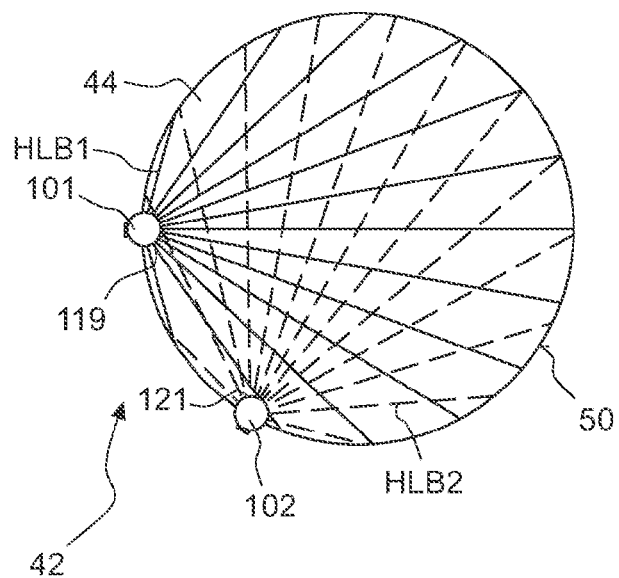
Fig. 17
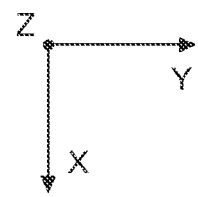
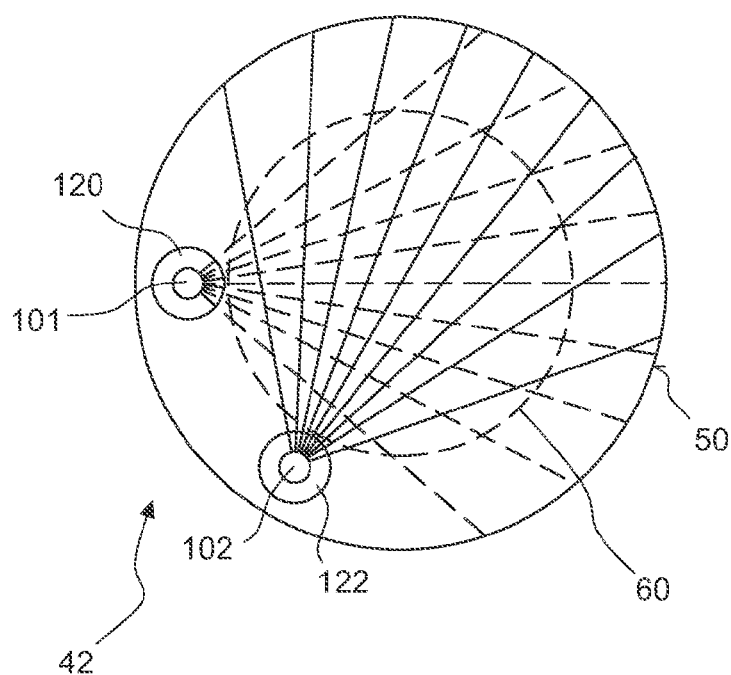
Fig. 18

MICROLITHOGRAPHIC APPARATUS

CROSS-REFERENCE TO RELATED APPLICATIONS

The present application is a continuation of, and claims benefit under 35 USC 120 to, international application PCT/EP2013/000728, filed Mar. 13, 2013. The entire disclosure of this application is incorporated by reference herein.

BACKGROUND OF THE INVENTION

1. Field of the Invention

The invention generally relates to a microlithographic apparatus, for example a projection exposure apparatus or a mask inspection apparatus. The invention relates in particular to such an apparatus comprising a wavefront correction device in which heating light distinct from projection light is directed towards a rim surface of a mirror substrate.

2. Description of Related Art

Microlithography (also called photolithography or simply lithography) is a technology for the fabrication of integrated circuits, liquid crystal displays and other microstructured devices. The process of microlithography, in conjunction with the process of etching, is used to pattern features in thin film stacks that have been formed on a substrate, for example a silicon wafer. At each layer of the fabrication, the wafer is first coated with a photoresist which is a material that is sensitive to radiation, such as deep ultraviolet (DUV), vacuum ultraviolet (VUV) or extreme ultraviolet (EUV) light. Next, the wafer with the photoresist on top is exposed to projection light through a mask in a projection exposure apparatus. The mask contains a circuit pattern to be projected onto the photoresist. After exposure the photoresist is developed to produce an image corresponding to the circuit pattern contained in the mask. Then an etch process transfers the circuit pattern into the thin film stacks on the wafer. Finally, the photoresist is removed. Repetition of this process with different masks results in a multi-layered microstructured component.

A microlithographic projection exposure apparatus typically includes an illumination system, a mask alignment stage for aligning the mask, a projection objective and a wafer alignment stage for aligning the wafer coated with the photoresist. The illumination system illuminates a field on the mask that may have the shape of a rectangular slit or a narrow ring segment, for example.

One of the essential aims in the development of projection exposure apparatus is to be able to lithographically produce structures with smaller and smaller dimensions on the wafer. Small structures lead to high integration densities, which generally has a favorable effect on the performance of the microstructured components produced with the aid of such apparatus. Furthermore, the more devices can be produced on a single wafer, the higher is the throughput of the apparatus.

The size of the structures which can be generated depends primarily on the resolution of the projection objective being used. Since the resolution of projection objectives is inversely proportional to the wavelength of the projection light, one way of increasing the resolution is to use projection light with shorter and shorter wavelengths. The shortest wavelength currently used is 193 nm, which is in the vacuum ultraviolet (VUV) spectral range. Also apparatus using EUV light having a wavelength of about 13.5 nm are meanwhile commercially available. Future apparatus will probably use EUV light having a wavelength as low as about 6.8 nm. Since there are no optical materials available which are sufficiently transparent for EUV projection light, such apparatus are of the catoptric type, i.e. they contain only mirrors, but no lenses or other refractive optical elements.

The correction of image errors (i.e. aberrations) is becoming increasingly important for projection objectives with very high resolution. Different types of image errors usually require different correction measures.

The correction of rotationally symmetric image errors is comparatively straightforward. An image error is referred to as being rotationally symmetric if the wavefront error in the exit pupil of the projection objective is rotationally symmetric. The term wavefront error refers to the deviation of an optical wavefront from the ideal aberration-free wavefront. Rotationally symmetric image errors can be corrected, for example, at least partially by moving individual optical elements along the optical axis.

Correction of those image errors which are not rotationally symmetric is more difficult. Such image errors occur, for example, because lenses or mirrors heat up rotationally asymmetrically. One image error of this type is astigmatism.

A major cause for rotationally asymmetric image errors is a rotationally asymmetric heating of the optical elements.

For example, in projection exposure apparatus of the scanner type the field that is illuminated on a mask is usually slit-shaped. This slit-shaped illuminated field causes a non-uniform heating of those optical elements that are arranged in the vicinity of field planes. This heating, in turn, results in deformations of the optical elements and, in the case of lenses and other elements of the refractive type, in changes of their refractive index. If the materials of refractive optical elements or of mirror substrates are repeatedly exposed to the high energetic projection light, also permanent material changes are observed. For example, a compaction of the materials exposed to the projection light sometimes occurs. In the case of refractive optical elements this may result in a local and permanent change of the refractive index, and in the case of mirror substrates in a local and permanent change of the surface shape of the substrate. Apart from that, the very complex and expensive reflective multi-layer coatings of EUV mirrors may be damaged by high local light intensities so that the reflectance is locally altered. The same also applies to the anti-reflection coatings that are usually applied on the optical surfaces of lenses and other refractive optical elements.

Another major cause for rotationally asymmetric heating are certain asymmetric illumination settings in which the pupil plane of the illumination system is illuminated in a rotationally asymmetric manner. Important examples for such settings are dipole settings in which only two poles are illuminated in the pupil plane. With such a dipole setting, also the pupil planes in the projection objective contain two strongly illuminated regions. Consequently, lenses or mirrors arranged in or in the vicinity of such a pupil plane are exposed to a rotationally asymmetric intensity distribution giving rise to rotationally asymmetric image errors. Also quadrupole settings often produce rotationally asymmetric image errors, although to a lesser extent than dipole settings.

Generally, heat induced deformations, index changes and coating damages alter the optical properties of the optical elements and thus cause image errors. Heat induced image errors sometimes have a twofold symmetry. However, image errors with other symmetries, for example threefold or fivefold, are also frequently observed in projection objectives.

In order to correct rotationally asymmetric image errors, U.S. Pat. No. 6,338,823 B1 proposes a lens which can be selectively deformed with the aid of a plurality of actuators distributed along the circumference of the lens. The deformation of the lens is determined such that heat induced image errors are at least partially corrected. However, if a lens is deformed, this involves necessarily the deformation of both optical surfaces of the lens. Usually the effects caused by each lens surface compensate each other to some extent so that only significant deformations produce the desired correction of the image error.

For that reason it has been proposed to use deformable mirrors to correct image errors. In EUV apparatus, in which refractive optical elements cannot be used, any deformable optical element has to be a mirror, anyway. Deformable mirrors for microlithographic apparatus are disclosed in U.S. Pat. No. 6,897,940 and U.S. Pat. No. 5,986,795, for example.

US 2010/0201958 A1 and US 2009/0257032 A1 disclose a correction device that comprises two transparent optical elements that are separated from each other by a liquid layer. In contrast to the device described in the aforementioned U.S. Pat. No. 7,830,611 B2, a wavefront correction is not obtained by deforming the optical elements, but by changing their refractive index locally. To this end one optical element may be provided with heating stripes that extend over the entire surface. The liquid ensures that the average temperatures of the optical elements are kept constant. It is also mentioned that the heating elements may be applied on or behind a reflective surface of a mirror. Although even higher order wavefront errors can be corrected very well, this device has a complex structure and is therefore expensive.

WO 2004/092843 A2 discloses a correction device for an EUV projection objective that directs correction light towards the reflective surface of a mirror. The correction light is controlled such that the temperature in the vicinity of the reflective surface comes close to the temperature where the coefficient of thermal expansion of the mirror substrate is zero.

EP 0 532 236 A1 discloses another correction device for an EUV projection objective. In one embodiment infrared radiation is directed on one of the mirrors of the objective. The infrared light is controlled such that the shape of the mirror does not substantially alter even under the impact of the high energy EUV projection light. In other embodiments heating or cooling devices are integrated into the mirror support for the same purpose.

U.S. Pat. No. 6,504,597 B2 proposes a correction device in which heating light is coupled into a lens or a mirror via its peripheral rim surface, i.e. circumferentially. Optical fibers may be used to direct the heating light produced by a single light source to the various locations distributed along the periphery of the optical element. It is also mentioned that this device may not only be used to homogenize the temperature distribution of the optical element, but also to correct wavefront errors caused in other optical elements. Although this device makes it possible to heat up also optical elements that are very densely stacked, it is only capable of producing comparatively coarse temperature distributions. More complex temperature distributions cannot be attained because only very few and strongly divergent heating light beams can be coupled into the optical element.

SUMMARY OF THE INVENTION

1. Focusing Optical Element

There is thus a need for a lithographic apparatus with a correction device comprising a deformable mirror that is capable to correct also higher order wavefront errors, but nevertheless has a simple construction.

In accordance with the present invention this problem is achieved by a microlithographic apparatus comprising an illumination system and a projection objective that is configured to image a pattern on a surface using projection light. The apparatus, and in particular its projection objective, comprises a wavefront correction device with a mirror that comprises a mirror substrate having a front surface, a back surface and a circumferential rim surface extending between the front surface and the back surface. The mirror further comprises a reflective coating which is supported by the front surface of the mirror substrate, wherein the reflective coating is configured to reflect impinging projection light. The wavefront correction device further comprises a first optical system that is configured to direct first heating light to a first portion of the rim surface such that at least a portion of the first heating light enters the mirror substrate, and a second optical system that is configured to direct second heating light to a second portion of the rim surface, which is distinct from the first portion, such that at least a portion of the second heating light enters the mirror substrate. A temperature distribution caused by a partial absorption of the first and the second heating light in the mirror substrate results in its deformation that changes, and in particular corrects, a wavefront error. At least the first optical system comprises a focusing optical element that is configured to focus the first heating light in a focal area such that the first heating light emerging from the focal area impinges on the first portion of the rim surface.

Since the invention uses heating light and not electrical wires or liquids to produce a temperature distribution inside the mirror substrate, the latter is kept free of any elements that could produce parasitic effects. Since the heating light is coupled into the mirror substrate via its circumferential rim surface, it is possible to achieve small angles of incidence and to apply an anti-reflective coating on the rim surface so that a major portion of the heating light is capable of entering the mirror substrate.

In order to be able to produce also complicated deformations or the mirror substrate, is necessary to provide a large number of heating light beams whose intensity (at least in the time average) can be individually adjusted. The larger the number of individual heating light beams is, the more likely it is that heating light internally reflected or scattered in the mirror substrate may find its way back to a heating light source. However, the operation and stability of many suitable types of light sources, for example lasers, laser diodes or LEDs, is significantly compromised if the emitted light is reflected back into the light source. This may even lead to damages or its complete failure.

In order to prevent that a significant fraction of the emitted heating light is reflected into the light source, the correction device in accordance with the present invention provides a focusing optical element so that the heating light entering the mirror substrate emerges from a focal area. This ensures that only light that passes through the focal area is allowed to get back to the light source. Since heating light scattered or internally reflected is usually not able to leave the mirror substrate such that it passes through the focal area, the light source is very effectively protected against reflected heating light.

The provision of a focal area effectively results in point or line light sources having well defined optical properties. These effective light sources can be arranged very closely to the mirror substrate so that the required volume for the correction device can be kept small. Furthermore, heating light emerging from such a point or line source produces a fan of heating light beams. If two, three or a few more such fans overlap in the mirror substrate, a very good coverage of a central portion of the mirror substrate with heating light beams can be achieved.

A good coverage is also achieved if the originally diverging fan is collimated by a cylindrical rim surface, or more generally if at least the first portion of the rim surface is convex in a plane at a position, where the mirror substrate is arranged. It may even be achieved that at least the first heating light, after it has entered the mirror substrate, propagates through the mirror substrate as collimated light. This is often advantageous because it ensures a homogenous coverage of heating light beams in a central portion of the mirror substrate.

The protection of the light source against reflected or scattered heating light can be further improved if at least the first optical system comprises a blind having an aperture in which the focal area is positioned. Then it is not (or not only) the focusing element (or strictly speaking its rim or mount) which obstructs reflected or scattered heating light, but the blind.

At least the first portion of the rim surface, where the first heating light enters, may be curved in a plane intersecting this portion and containing a symmetry axis of the mirror. Then the rim surface has optical power in that plane which may be used, for example, to collimate heating light in that plane. In particular the rim surface may comprise a toroidal surface; in that case the mirror substrate may, for example, have the shape of a barrel. The rim surface may also be constituted from a plurality of planar surfaces that result in a rectangular or polygonal cross section of the mirror substrate.

The correction device may comprise a light source, which is configured to emit heating light, and a beam splitter which splits the heating light emitted by the light source into the first heating light and the second heating light. In other words, a single light source is used to supply heating light to two or more optical systems that are used to direct heating light towards the rim surface of the mirror substrate. A laser may be used as light source in such embodiments.

It is also envisaged to provide individual light sources for the first, the second and any further optical system. Then the first optical system comprises a single first light source, which is configured to produce the first heating light, and the second optical system comprises a single second light source, which is configured to produce the second heating light.

Irrespective whether the optical systems have their own light source or share a common light source, it is advantageous if at least the first optical system comprises a spatial light modulator that is configured to change (preferably continuously) the intensity of the first heating light in a spatially resolved manner so as to produce a plurality of first heating light beams whose intensity can be changed individually by the spatial light modulator. By splitting up the first heating light into a plurality of first heating light beams it is possible to produce not only a number of light beams that equals the number of optical systems, but to multiply this number considerably. For example, if the spatial light modulator produces 10 or 100 or even 1000 individual heating light beams, a correction device comprising three optical systems may produce 30, 300 or 3000, respectively, individual heating light beams which pass through the mirror substrate along various directions. Then also very complicated temperature distributions can be produced.

In one embodiment the spatial light modulator comprises an array of beam deviating elements, wherein each beam deviating element is configured to deflect impinging first heating light by a deflection angle that is variable in response to a control signal. Such beam deviating elements may be formed by tiltable micromirrors or by transparent elements exploiting the opto-acoustic effect.

In another embodiment the spatial light modulator comprises a variable blind having a plurality of apertures whose size and/or transmissivity can be changed individually in response to a control signal.

In a still further embodiment the spatial light modulator comprises a reflective surface and a driver which is configured to change the spatial orientation of the reflective surface. In that case the plurality of first heating light beams is not produced simultaneously, but successively in a kind of scanning arrangement.

Instead of providing a single light source and a spatial light modulator, it is also possible to have a first optical system comprising a plurality of first light sources, wherein each first light source is configured to produce a first heating light beam.

At least one first light source may be an LED having an intensity that can be varied individually.

At least one first light source may be a laser diode. Then the first optical system may comprise a light modulator that is configured to change the intensity of the first heating light beam emitted by the first light source individually.

At least the first optical system may comprise a reflective surface that reflects first heating light after it has traversed the mirror substrate. The reflective surface may be formed by a multi-layer coating applied to the rim surface, a multi-layer coating applied to a substrate that is arranged at a distance from the mirror substrate, or by a surface of a prism. By directing heating light back to the mirror substrate it is possible to reduce the light losses and thus to increase the efficiency of the correction device.

In order to avoid that heating light reflected at the reflective surface gets back to the light source, the reflective surface may be arranged such that the direction of reflected light differs from the direction of impinging light. This may be achieved, for example, by using a curved reflective surface or a planar surface which is slightly tilted so that the heating light does not impinge perpendicularly on the planar reflective surface.

The direction of reflected light may differ from the direction of impinging light by a very small angle, for example an angle between 180.05° and 185° (the angle of 180° is a result of the reversal of the light propagation direction at the reflective surface).

The first optical system may comprise a beam deviating element that is configured to deflect the first heating light such that the focusing optical element is arranged completely above or completely below the rim surface of the mirror substrate. This may imply that a plane, in which the heating light propagates when it enters the light deviating element, is parallel to a plane in which it propagates through the mirror substrate. For example, the beam deviating element may be formed by a prism having an inclined surface which forms an angle of 45° with respect to the optical axis. If the rim surface of the mirror substrate is conical with a cone angle of 45°, the propagation path of the heating light may be folded twice by 90° using total internal reflection so that an axial displacement of the propagation path is achieved.

The focusing element and the mirror substrate may both have the optical effect of positive lenses, and in particular of cylindrical lenses, in a plane. If the mirror is arranged in the projection objective, the mirror substrate is thus part of two optical systems, namely of the projection objective, which guides the projection light, and of the correction device through which heating light passes.

In that case the total volume of the focusing element may be much smaller, for example at least 100 times, preferably at least 300 times, smaller than the total volume of the mirror substrate.

The first heating light may propagate in a first plane and the second heating light may propagate in a second plane, wherein the first plane and the second plane may be either identical or parallel to each other. Other arrangements of these planes are also possible, for example tilted arrangements in which the planes may intersect or not.

Depending on whether the focusing optical element has a focusing power in only one or in two orthogonal directions, the focal area will be a focal point or a focal line, respectively. If the focusing element has a focusing power only along one direction, it may be formed by a cylindrical lens or a cylindrical mirror.

The first heating light and the second heating light may have a center wavelength between 0.4 µm and 3 µm and the projection light may have the center wavelength between 5 nm and 50 nm. If glasses containing a substantial amount of titan, such as Zerodur® or ULE®, are used for the mirror substrate, the first heating light and the second heating light may have a center wavelength between 0.4 µm and 0.8 µm. At these wavelengths Ti doped materials for the mirror substrate have a reduced coefficient of transmittance so that a sufficient percentage of heating light is absorbed.

If the Ti concentration is not sufficiently homogeneous, its fluctuations may be taken into account when the intensities of the first and second heating light are determined.

Generally the first heating light and the second heating light may have a different center wavelength, but often it will be preferred to use first and second heating light having the same center wavelength.

The deformation of the mirror substrate due to a partial absorption of the first and the second heating light will generally be determined such that a wavefront error is at least partially corrected. A correction of a wavefront error usually implies that the root mean square (RMS) of Zernike coefficients used to describe the wavefront errors is reduced. In some cases, however, it may be more prudent not to reduce the RMS, but to change the wavefront error such that it can be more easily corrected by other manipulators or correction means. Such a change of the wavefront error may sometimes result in an even greater RSM, but to the avail of being able to reducing it much further by other means. For example, a highly asymmetric wavefront error resulting in a small RMS may be transformed into a rotationally symmetric wavefront error which results in a greater RMS, but can be corrected easily by manipulators that displace an entire mirror.

In one embodiment the first optical system comprises first light detectors that are configured to measure irradiance variations of the first heating light beams after they have left the mirror substrate. Similarly, the second optical system comprises second light detectors that are configured to measure irradiance variations of the second heating light beams after they have left the mirror substrate. This makes it possible to monitor the proper function of light sources that produce the first and second heating light beams.

In that case the apparatus may also comprise a control unit which is configured to control the first optical system and the second optical system depending on the irradiance variations measured by the first and second detectors. This makes it possible to produce more accurately a desired temperature distribution inside the mirror substrate.

In another embodiment at least the first optical system comprises an optical fiber that is configured to guide the first heating light from a first light source, which is arranged outside the projection objective, to the focusing optical element. Such an arrangement of the first light source outside the projection objective is advantageous because it is then possible to replace a defect light source arranged inside the projection objective without a need to dismount latter.

In still another embodiment the correction device comprises a cooling system which is configured to actively cool the mirror substrate. This makes it possible to maintain a neutral heat balance and to quickly change the temperature distribution inside the mirror substrate.

In principle the mirror may also support the pattern that is imaged by the projection objective on the surface. Then the mask itself forms the correction device. Subject of the invention, according to this aspect, is thus a microlithographic apparatus, comprising a reflective mask that has a mirror substrate having a front surface, a back surface and a circumferential rim surface extending between the front surface and the back surface, and a reflective coating which is supported by the front surface of the mirror substrate and that form a pattern to be imaged on an image plane of a projection objective. A light source is configured to emit heating light, and an optical system directs the heating light towards a portion of the rim surface.

2. Immersed Mirror Substrate

Subject of the present invention is also a projection objective of a microlithographic apparatus, wherein the projection objective is configured to image a mask on an image plane of the projection objective using projection light. The projection objective comprises a wavefront correction device comprising a mirror that has a mirror substrate having a front surface, a back surface and a circumferential rim surface extending between the front surface and the back surface, and a reflective coating which is supported by the front surface of the mirror substrate, wherein the reflective coating is configured to reflect impinging projection light. The wavefront correction device further comprises a light source which is configured to emit heating light such that it impinges on the rim surface. A volume confined by the mirror substrate and the light source is filled by an optical medium that is a liquid, a solid or a mixture of a liquid and a solid such as a gel or a paste. Preferably the optical medium has a similar refractive index as the mirror substrate. In particular, the refractive index ratio of the optical medium and the mirror substrate may be at 22° C. between 0.80 and 1.1.

By immersing the mirror substrate in an optical medium, which may be formed by an optical adhesive, for example, refraction at the rim surface is suppressed or at least significantly reduced. This simplifies the coupling of heating light into the mirror substrate, particularly if the rim surface is cylindrical. For example, a straight bar containing a plurality of LEDs or laser diodes may then emit parallel heating light beams, and the collimated nature of these heating light beams is maintained after the heating light has entered the mirror substrate.

3. Fresnel Lens Rim

Subject of the present invention is also a projection objective of a microlithographic apparatus, wherein the projection objective is configured to image a mask on an image plane of the projection objective using projection light. The projection objective comprises a wavefront correction device comprising a mirror that has a mirror substrate having a front surface, a back surface and a circumferential rim surface extending between the front surface and the back surface, and a reflective coating which is supported by the front surface of the mirror substrate, wherein the reflective coating is configured to reflect impinging projection light. The wavefront correction device further comprises a light source which is configured to emit heating light such that it impinges on the rim surface. A portion of the rim surface, at which the heating light impinges, is formed as a Fresnel lens having a refractive power at least along one direction.

Also this measure simplifies the coupling of heating light into the mirror substrate. In contrast to conventional lenses formed directly on the rim surface, a Fresnel lens makes it possible to achieve significantly stronger optical power.

4. Recess or Bore in Mirror Substrate

Subject of the present invention is also a projection objective of a microlithographic apparatus, wherein the projection objective is configured to image a mask on an image plane of the projection objective using projection light. The projection objective comprises a wavefront correction device comprising a mirror that has a mirror substrate having a front surface, a back surface and a circumferential rim surface extending between the front surface and the back surface, and a reflective coating which is supported by the front surface of the mirror substrate, wherein the reflective coating is configured to reflect impinging projection light. The wavefront correction device further comprises a light source which is configured to emit heating light such that it impinges on the rim surface. The mirror substrate has a bore, a hole or a recess in which the light source is arranged such that the heating light enters the mirror substrate perpendicularly.

This approach ensures that minimum light losses occur at the rim surface, and even the application of an anti-reflection coating may be dispensed with. It also makes it possible to use a light source which is configured to emit heating light beams over an angular range of at least 40°.

5. Spatial Light Modulator

Subject of the present invention is also a projection objective of a microlithographic apparatus, wherein the projection objective is configured to image a mask on an image plane of the projection objective using projection light. The projection objective comprises a wavefront correction device comprising a mirror that has a mirror substrate having a front surface, a back surface and a circumferential rim surface extending between the front surface and the back surface, and a reflective coating which is supported by the front surface of the mirror substrate, wherein the reflective coating is configured to reflect impinging projection light. The wavefront correction device further comprises a light source which is configured to emit heating light such that it impinges on the rim surface. The correction device further comprises a spatial light modulator that is configured to direct the heating light produced by the light source towards different portions of the rim surface.

The provision of a spatial light modulator makes it possible to dispense with the provision of a very large number of individual light sources such as LEDs or laser diodes. Instead, only one or very few stronger light sources are used, and the heating light is then split into the individual heating light beams with the help of the spatial light modulator. This encompasses cases in which the various heating light beams are not simultaneously produced by the spatial light modulator, but successively, for example using a scanning set-up. In that case the spatial light modulator may comprise a reflective surface and a driver which is configured to change the spatial orientation of the reflective surface.

6. Reflective Surface on Mirror Substrate Rim

Subject of the present invention is also a projection objective of a microlithographic apparatus, wherein the projection objective is configured to image a mask on an image plane of the projection objective using projection light. The projection objective comprises a wavefront correction device comprising a mirror that has a mirror substrate having a front surface, a back surface and a circumferential rim surface extending between the front surface and the back surface, and a reflective coating which is supported by the front surface of the mirror substrate, wherein the reflective coating is configured to reflect impinging projection light. The wavefront correction device further comprises a light source which is configured to emit heating light such that it impinges on the rim surface. A reflective surface reflects at least 70% of heating light, which has traversed the mirror substrate, so that it traverses the mirror substrate again.

In this way more heating light will be absorbed by the mirror substrate, and thus the efficiency of the wavefront correction device is increased.

The reflective surface may formed as a reflective coating on the rim surface, or it may be arranged outside the mirror substrate.

7. Reduction of Thermal Expansion Effects

In the foregoing it has been described how the production of a certain temperature distribution in the mirror substrate may be used to change, and in particular to correct, wavefront errors. However, the ability to produce a 2D or 3D temperature distribution inside the mirror substrate with the help of heating light directed towards its rim surface is also helpful if it is desired, one might say in a preceding step, to prevent the occurrence of heat induced wavefront errors altogether. As it has been described at the outset, heat induced wavefront errors are mainly the result of the absorption of projection light in the reflective coating of the mirror. The ability to produce almost any arbitrary temperature distribution in the mirror substrate can then be used to maintain a constant temperature distribution in the mirror substrate irrespective of how much and at which locations projection light is absorbed by the mirror.

Conventionally, glasses are used as materials for the mirror substrates. These glasses have, at the operating temperature of the mirror, a very small or even zero coefficient of thermal expansion. Such glasses are commercially available from various suppliers. For example, Corning and Schott market such glasses under the brand names ULE® and Zerodur®, respectively. These glasses may be manufactured so that the coefficient of thermal expansion becomes zero exactly at the operating temperature of the mirror. Then small changes of the temperature do not result in a thermal expansion or contraction. This, in turn, ensures that the shape of the mirror substrate does not change if the temperature variations do not exceed certain limits.

However, it has turned out that, in spite of considerable efforts by the manufacturers of such glasses, it is difficult to produce glass blanks having perfectly homogenous properties. In particular, the temperature at which the coefficient of thermal expansion becomes zero, or generally where it has its absolute minimum, may slightly vary over the volume of the glass blank. If such a blank is used to manufacture a mirror substrate, temperature changes may locally produce deformations although the same temperature originally prevailed within the entire mirror substrate.

It is therefore an object of the invention to provide a method how undesired heat induced deformations resulting from inhomogeneous glass properties may be avoided.

In accordance with the present invention this object is achieved by a method of operating a microlithographic apparatus comprising the following steps:
a) providing a projection objective containing a mirror that has a mirror substrate and a reflective coating applied on the mirror substrate, wherein the reflective coating is configured to reflect impinging projection light;
b) measuring at a first location of the mirror substrate a first temperature at which the absolute value of the coefficient of thermal expansion has a minimum;
c) measuring at a second location of the mirror substrate a second temperature at which the absolute value of the coefficient of thermal expansion has a minimum, wherein the first location is different from the second location (and, at least generally, wherein the second temperature will be different from the first temperature);
d) changing a temperature distribution in the mirror substrate so that the temperature at the first location equals the first temperature and the temperature at the second location equals the second temperature.

The invention is based on the perception that if the distribution of the temperature, at which the absolute value of the coefficient of thermal expansion has a minimum, is measured, it is possible to produce, preferably by illuminating the mirror substrate with heating light, a temperature distribution which is at least substantially identical to the distribution of the temperature at which the absolute value of the coefficient of thermal expansion has an absolute minimum. If then the temperature distribution changes as a result of projection light being absorbed by the reflective coating, the mirror substrate will not deform, or at least the deformations will be kept at a minimum, because at each point in the mirror substrate a temperature prevails that ensures a minimum deformation due to temperature changes. If the mirror substrate has a temperature where the coefficient of thermal expansion becomes zero, it may even be achieved that no deformations at all occur if the temperature changes are kept within certain limits. Notably this holds true even if the temperature, at which the coefficient of thermal expansion is zero, varies over the volume of the mirror substrate.

As mentioned before, the temperature distribution is changed in step d) preferably by illuminating the mirror substrate with heating light. In principle, however, the heating could also be accomplished with cooling means or with other heating means, for example heating wires that extend through bores provided in the mirror substrate. The heating light, which preferably has a center wavelength that is different from a center wavelength of the projection light, is preferably directed in step d) on a circumferential rim surface of the mirror substrate that extends between a front surface supporting the reflective coating and a back surface of the mirror substrate.

In order to be able to produce a 3D temperature distribution in the mirror substrate, a first set of heating light beams may be directed on the rim surface so that the heating light beams extend through the mirror substrate in a first plane. A second set of heating light beams may be directed on the rim surface so that the heating light beams extend through the mirror substrate in a second plane that is different from the first plane. In other words, by arranging the heating light beams in different planes, it is possible to heat up not only a single plane in the mirror substrate, but a larger portion or even its entire volume.

In order to produce the temperature distribution as defined in step d), it may be expedient to measure the temperature distribution in the mirror substrate between steps c) and d). This is because setting a certain temperature distribution in step d) may be difficult if it is not possible to verify whether the first and second temperatures have indeed been obtained or not. For measuring a 3D temperature distribution one or more heat cameras may be used, for example. From a heat image of the reflective coating it is possible to deduce the 3D temperature distribution inside the mirror substrate.

DEFINITIONS

The term "light" denotes any electromagnetic radiation, in particular visible light, UV, DUV, VUV and EUV light.

The term "light ray" is used herein to denote light whose path of propagation can be described by a line.

The term "light beam" is used herein to denote a plurality of substantially collimated light rays. A light beam usually has a substantially continuous intensity profile across its diameter.

The term "surface" is used herein to denote any planar or curved surface in the three-dimensional space. The surface may be part of a body or may be completely separated therefrom.

The term "optically conjugate" is used herein to denote the imaging relationship between two points or two surfaces. Imaging relationship means that a light bundle emerging from a point converges at the optically conjugate point.

The term "field plane" is used herein to denote a plane that is optically conjugate to the mask plane.

The term "pupil plane" is used herein to denote a plane in which marginal rays passing through different points in the mask plane or another field plane intersect. As usual in the art, the term "pupil plane" is also used if it is in fact not a plane in the mathematical sense, but is slightly curved so that, in a strict sense, it should be referred to as pupil surface.

The term "optical power" is used to denote the ability of an optical element to have a diverging or converging effect on light. An optical element having a positive optical power thus has a converging effect, and an optical element having a negative optical power has a diverging optical effect. Optical elements having an optical power may be of the refractive, the reflective or the diffractive type.

BRIEF DESCRIPTION OF THE DRAWINGS

Various features and advantages of the present invention may be more readily understood with reference to the following detailed description taken in conjunction with the accompanying drawings in which:

FIG. 14 is a top view on a correction device in which two curved LED bars are used as light sources;

FIG. 15 is a top view of a correction device similar to the device shown in FIG. 14, but comprising 15 LED bars;

FIG. 16 is a schematic cross section through the correction device shown in FIG. 15 along line XVI-XVI;

FIG. 17 is a top view of a correction device in which two strongly curved LED bars are arranged in recesses at the rim surface of the mirror substrate;

FIG. 18 is a top view of a correction device in which two strongly curved LED bars are arranged in bores provided in the mirror substrate;

DESCRIPTION OF PREFERRED EMBODIMENTS

I. General Construction of Projection Exposure Apparatus

Figure 1:
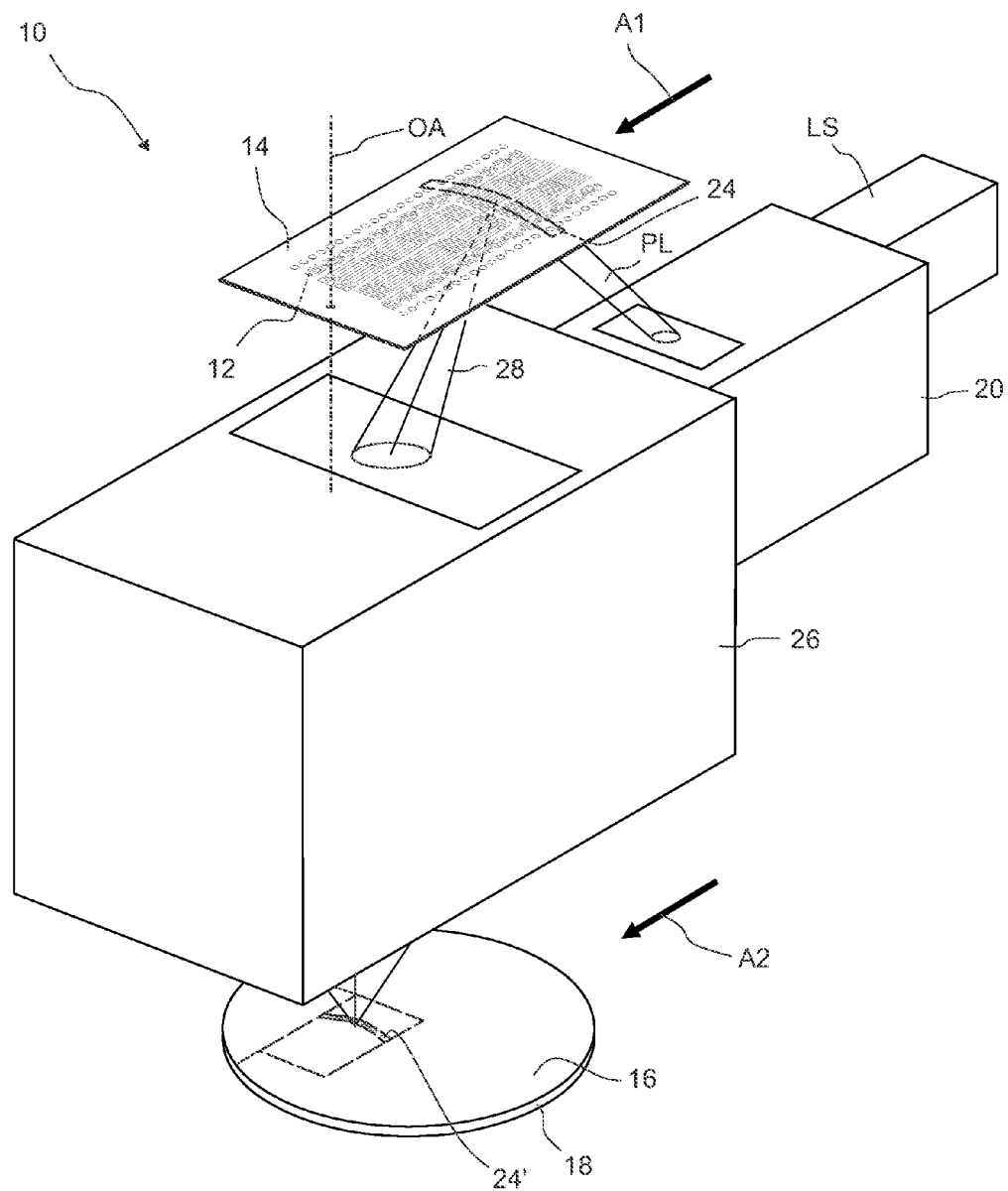
FIG. 1 is a schematic perspective view of a projection exposure apparatus in accordance with one embodiment of the present invention.

FIG. 1 is a perspective and highly schematic illustration showing a projection exposure apparatus 10 in accordance with the present invention. The apparatus 10 serves to image a pattern of reflecting structures 12, which are arranged on the underside of a mask 14, on a light-sensitive layer 16 which may be formed, for example, by a photoresist. The light-sensitive layer 16 is supported by a wafer 18 or another suitable substrate which is held by a wafer stage (not shown in FIG. 1).

The projection exposure apparatus 10 comprises a light source LS that is configured to produce projection light PL having a center wavelength between 5 nm and 30 nm. In the embodiment shown the center wavelength of the projection light PL is approximately 13.5 nm and therefore lies in the extreme ultraviolet spectral range (EUV). Other center wavelengths, in particular between 6.6 nm and 6.8 nm, are also possible.

The light source may be a free-electron laser (FEL), as known from WO 2009/121438 A1, for example, or a laser plasma source. The projection exposure apparatus 10 further comprises an illumination system 20 which directs the projection light PL produced by the light source LS on the underside of the mask 14, where it illuminates a field that will be referred to in the following as illumination field 24. The latter has, in the embodiment shown, the geometry of a ring segment.

The projection exposure apparatus 10 further comprises a projection objective 26 which images the structures 12, which are situated at a given time inside the illumination field 24, on the light-sensitive layer 16. The projection objective 26 has a magnification β with |β|<1 so that a reduced image 24' of the structures 12 situated in the region of the illumination field 24 is formed on the light-sensitive layer 16.

The projection exposure apparatus 10 is designed for a scanning operation during which the mask 14 is displaced synchronously with the wafer 18 during the exposure of the light-sensitive layer 16. The displacement movements of the mask 14 and of the wafer 18 are indicated in FIG. 1 by arrows A1 and A2, respectively. The ratio of the speeds of the wafer 18 to the mask 14 is equal to the magnification β of the projection lens 26. In the embodiment shown the image 24 is erect (β>0) so that the mask 14 and the wafer 18 move along the same direction during an exposure operation. Since the illumination field 24 passes over the mask 14 in a scanner-like fashion during the exposure operation, regions being significantly larger than the illumination field can be transferred to the light-sensitive layer 16.

In FIG. 1 a light bundle 28 is indicated that emerges from a point within the illumination field 24. The light bundle 28 enters the projection objective 26, which forces the light bundle 28 to converge on a single point in the image plane of the projection objective 26 in which the light-sensitive layer 16 is arranged. The relationship between field points in the object plane of the projection objective 26, in which the structures 12 are arranged, and the image plane, in which the light-sensitive surface 16 is arranged, is usually referred to as imaging relationship or optical conjugation.

The opening angle of the light bundle 28 entering the projection objective 26 is a measure of its object-side numerical aperture NA. As a result of the magnification |β|<1, the image-side numerical aperture NA of the projection objective 26 is increased by the reciprocal of the magnification |β|.

Figure 2:
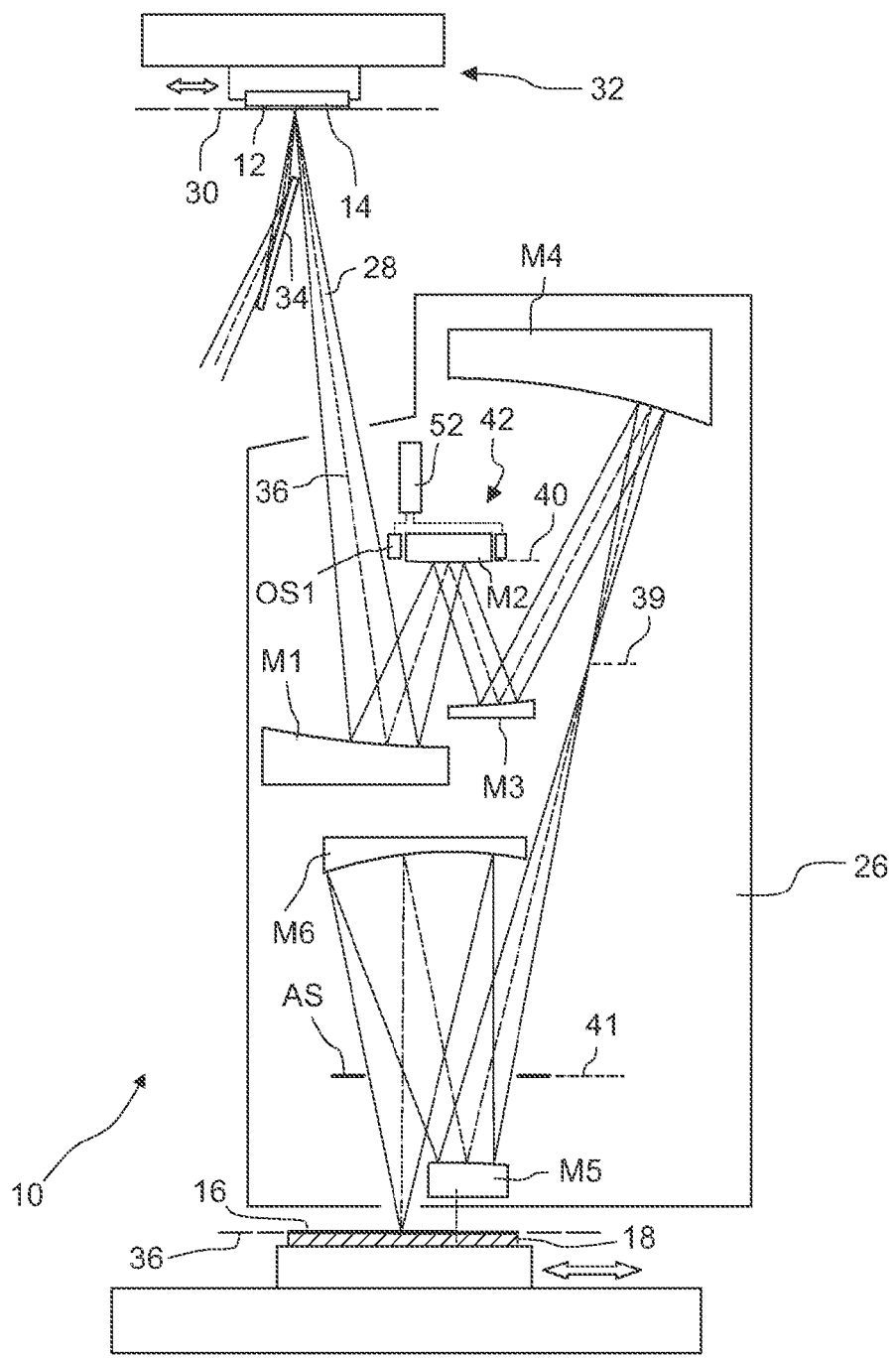
FIG. 2 is schematic meridional section through the apparatus shown in FIG. 1.

FIG. 2 is schematic meridional section through a portion of the projection exposure apparatus shown in FIG. 1. A mask stage holding and moving the mask accurately in the object plane 32 of the projection objective 26 is denoted by 32. Projection light PL that is directed by the illumination system 20 (here via a grazing incidence mirror 34) is reflected from the mask 14 and enters the projection objective 26. There six mirrors M1 to M6 reflect the projection light PL towards the light sensitive surface 16. The latter is arranged in the image plane 36 of the projection objective 26 and is supported by the wafer 18 that is held and moved by a wafer stage 38.

In this embodiment the mirror M2 is arranged in or in close proximity to the first of two pupil planes 40, 41 of the projection objective 26. The two pupil planes 40, 41 are optically conjugate to each other and also to a pupil plane in the illumination system 20. Angles in a pupil plane 40, 41 translate into positions in the image plane 36 or another field plane such as the intermediate image plane 39. Similarly, positions in a pupil plane 40, 41 translate into angles in the image plane 36. In the second pupil plane 41 an aperture stop AS is arranged.

II. Correction Device

Figure 3:
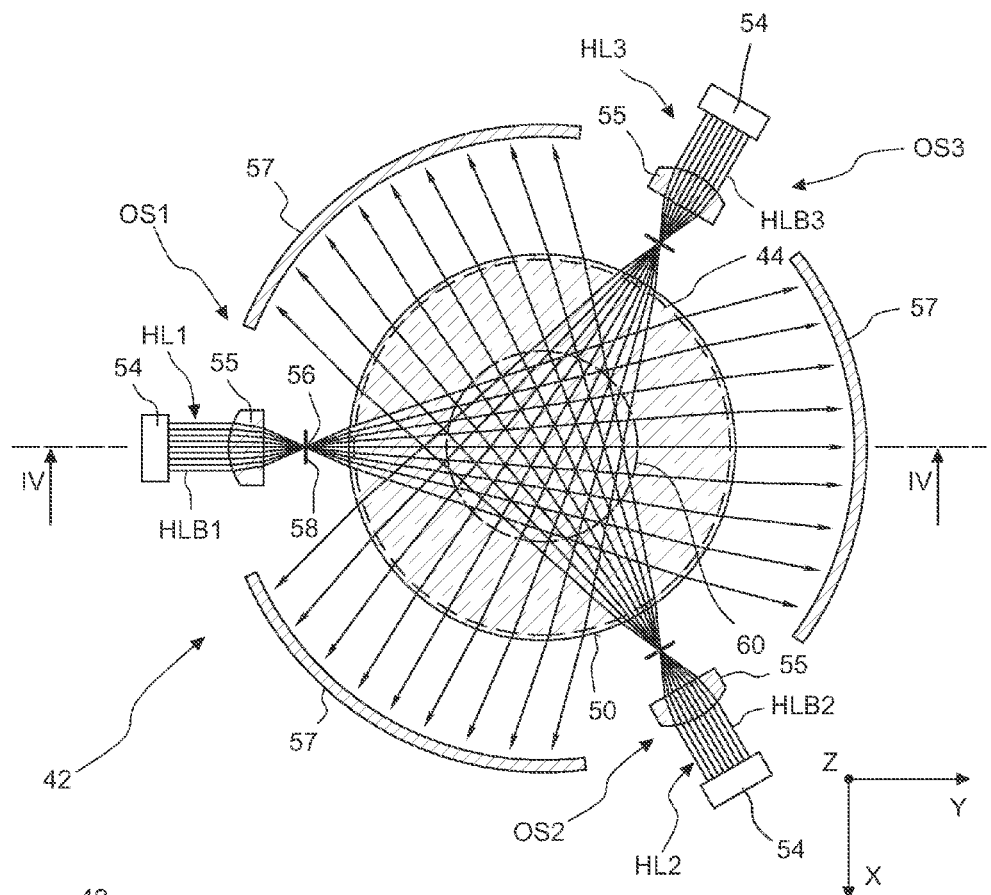
FIG. 3 is a schematic cross section in an XY plane through a correction device according to a first embodiment that is contained in a projection objective being part of the apparatus shown in FIGS. 1 and 2.

The projection objective 26 contains a correction device 42 for correcting wavefront errors that is arranged in the first pupil plane 40 and includes the mirror M2. A cross section through the correction device 42 parallel to the XY plane is shown in FIG. 3. As can best be seen in the cross section of FIG. 4 along line IV-IV, the mirror M2 forming part of the correction device 42 comprises a mirror substrate 44 that has a front surface 46, which supports a reflective multi-layer coating 47, and a back surface 48 opposite the front surface. The mirror substrate 44 has a circumferential rim surface 50 extending between the two surfaces 46, 48. In this embodiment the front surface 46, which mainly defines the optical properties of the mirror M2, is convexly curved, the back surface is planar, and the rim surface 50 is toroidal.

The correction device 42 further comprises a first optical system OS1 that is configured to direct first heating light HL1 to a first portion of the rim surface 50 such that at least a portion of the first heating light HL1 enters the mirror substrate 44. A second optical system OS2 is also configured to direct second heating light HL2 to a different portion of the rim surface 50 so that at least a portion of the second heating light HL2 enters the mirror substrate 44. The correction device 42 also comprises a third optical system OS3 which is only shown in the cross section of FIG. 3.

The optical systems OS1, OS2, OS3 are in signal communication with a control unit 52 (see FIG. 2) which controls the emission of heating light HL1, HL2, HL3 by the optical systems OS1, OS2 and OS3, respectively.

Referring now to the cross section shown in FIG. 3, it can be seen that the first optical system OS1 comprises a first light source 54 which is configured to produce a plurality of first heating light beams HLB1 whose intensity can be varied individually by supplying a suitable control command from the control unit 52 to the first optical system OS1. To this end the first light source may comprise a plurality of individual light sources each producing one heating light beam HLB1. Alternatively, the first light source 54 may contain a single light emitter and splitting means that split the light emitted by the light emitter into the individual heating light beams. The individual heating light beams HLB1 may also be produced successively by a single light emitter using a kind of scanning set-up, for example.

The first optical system OS1 further comprises a cylindrical lens 55 which is arranged in the optical path between the light source 54 and the mirror substrate 44. The cylindrical lens 55 has a positive optical power only in the XY plane. Since the first heating light beams HLB1 are emitted from the light source 54 as parallel light beams, they converge in a focal line 56 which is arranged in a back focal plane of the cylindrical lens 55.

Figure 4:
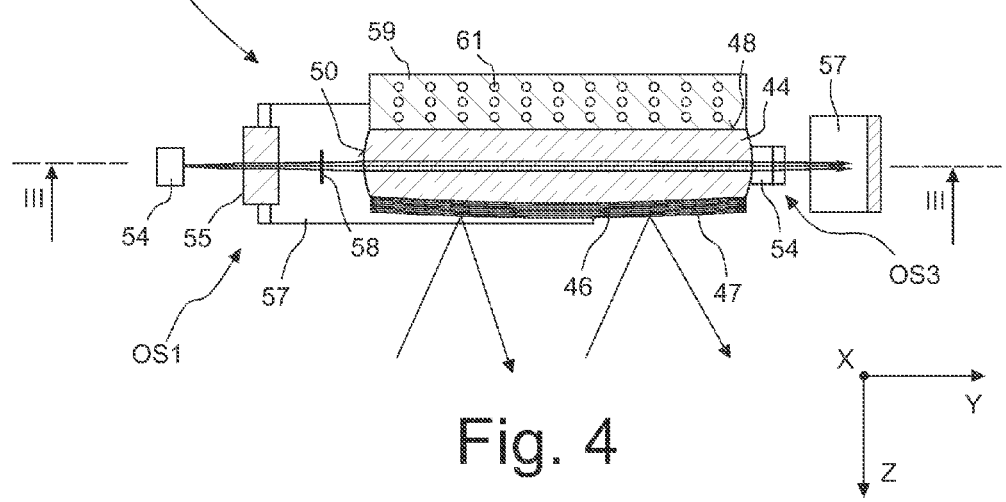
FIG. 4 is a schematic cross section through the correction device shown in FIG. 3 along line IV-IV.

The first heating light beams HLB1 emerging from the focal line 56 impinge on a portion of the rim surface 50 of the mirror substrate 44. As can be seen in FIG. 4, the rim surface 50 is curved so that it has a positive refractive power in all planes perpendicular to the back surface 48. An anti-reflection coating may be applied on the rim surface 50 to reduce reflection of the first heating light beams HLB1 when they impinge on the rim surface 50.

At the rim surface 50 first heating light beams HLB1 are refracted both in the XY plane and also in planes perpendicular to the back surface 48. As far as the refraction in XY planes is concerned, the rim surface 50 of the mirror substrate 44 thus has a similar converging effect as the cylindrical surface of the cylindrical lens 55. However, since the curvature of the rim surface 50 in the XY plane is smaller than the curvature of the cylindrical lens 55, the positive refractive power of the mirror substrate 44 is also smaller than the positive refractive power of the cylindrical lens 55. By carefully selecting the refractive power and the position of the cylindrical lens 55, it is possible to accurately define the angles under which the first heating light beams HLB1 extend through the mirror substrate 44.

The refractive power of the rim surface 50 in planes perpendicular to the back surface 48 is used to collimate the slightly diverging individual heating light beams HLB1 in these planes, as this is shown in FIG. 4.

The wavelength of the first heating light HL1 is adapted to the optical material of the mirror substrate 44 such that a significant portion of the first heating light HL1 is absorbed by the material. The absorbed heating light HL1 leads to a local temperature rise which, in turn, is accompanied by a deformation of the mirror substrate 44. Thus projection light PL impinging on the mirror M2 undergo a phase change as compared to the situation before the absorption of heating light HL1. This phase change can be used to correct a wavefront error.

The first heating light beams HLB1, or strictly speaking the portion of these light beams that has not been absorbed in the mirror substrate 44, impinges on the opposite rim surface 50 and is refracted again. This portion of the first heating light HL1 may be absorbed by an externally cooled absorber plate 57. Alternatively, this portion of the first heating light HL1 may leave the projection objective 26 through a transparent window (not shown) so that it does not contribute to the heat balance of the projection objective 26.

It is to be noted that even if an anti-reflection coating is applied to the rim surface 50, there will always be a fraction of the first heating light HL1 which is internally reflected at the back rim surface 50. Depending on the angle of incidence this fraction may be considerable. This internally reflected first heating light HL1 will also be gradually absorbed when it passes again through the mirror substrate 44. The internally reflected fraction of the first heating light HL1 will again be incident on another portion of the rim surface 44 where a fraction of the first heating light HL1 is reflected internally, again, etc. Also scattering at material impurities or imperfections may result in a small fraction of the first heating light that propagates along various and unknown directions through the mirror substrate 44.

However, typical light sources 54 such as lasers, laser diodes or LEDs are extremely sensible with regard to light that enters the component through its emission window. Even small light intensities of such light suffice to severely compromise the function of the component or may even damage the component in the short or long term.

The provision of the cylindrical lens 55 and the focal line 56 effectively prevents that internally reflected or scattered first heating light HL1 is able to get back into the light source 54. This is because only light rays passing through the small focal line 56 are capable of impinging on the light source 54.

In principle it would suffice to choose the dimensions of the cylindrical lens 55 such that it is as small as possible. However, it is usually more effective to arrange an additional blind 58 in the back focal plane of the cylindrical lens 55 having an aperture whose shape corresponds to the focal line 56. Then the blind 58 blocks all light rays which do not pass through the focal line 56. In this way a very effective protection of the light source 54 against heating light that is scattered or internally reflected at the rim surface 50 is provided.

The other two optical systems OS2, OS3 are constructed in the same way, i.e. they both comprise a light source 54, a cylindrical lens 55 and a blind 58. The three optical systems OS1, OS2, OS3 are arranged with three-fold symmetry in the first pupil plane 40 so that they are spaced apart by an angle of 120° from each other. As a result of this arrangement, there will be a central portion 60 within the mirror substrate 44 in which fans of the heating light HL1, HL2, HL3 coupled into the mirror substrate 44 by the optical systems OS1, OS2, OS3 completely overlap. In this central portion 60 it is thus possible to produce a wide range of different temperature distributions by individually controlling the intensity of each heating light beam HLB1, HLB2, HLB3 passing through the central portion 60.

In this embodiment the mirror substrate 44 is separated by a small gap from a cooling body 59 that contains a plurality of cooling channels through which a cooling fluid is guided during operation of the apparatus 10. The cooling body 59, which may be made of a metal such as copper, serves as a heat sink and ensures that the average temperature (i.e. the net heat balance) of the mirror substrate 44 is kept approximately constant even if a considerable amount of heating light is absorbed.

In order to facilitate the adjustment of the aforementioned optical components during the assembly of the correction device 42, it may be expedient to design the optical components such that they are achromatic for an adjustment wavelength which is in the visible spectrum. Then the path of the heating light beams HLB1, HLB2, HLB3 may be tested during the adjustment with the help of visible light that is produced by a light source being arranged, for example, at positions where the heating light beams HLB1, HLB2, HLB3 leave the mirror substrate 44.

An even simpler, but less convenient approach is to use during the adjustment process special films that change their color under the impact of the heating light beams HLB1, HLB2, HLB3.

III. Control of Correction Device

In a first step the wavefront errors, which shall be corrected with the help of the correction device 42, have to be determined by simulation and/or measurement. Measurements may involve the detection of an aerial image formed in the image plane 36 of the projection objective 26 with the help of an interferometric wavefront measuring device. The deviation of the measured wavefronts from an ideal wavefront is considered as wavefront error that is to be corrected.

Since the correction device 42 is arranged in the first pupil plane 40, it will affect the wavefront associated with different field points in the same manner. If it is desired to perform a correction of field dependent wavefront errors, it is necessary to arrange the correction device 42 outside the pupil planes 40, 41, or to provide a second correction device in or in close proximity to a field plane, for example the intermediate image plane 39.

Once the wavefront errors and the necessary corrections have been determined, the intensities of the individual heating light beams HLB1, HLB2, HLB3 can be calculated using established optimization approaches. In this context the following steps may be carried out:

In a first step it has to be determined where the heating light beams HLB1, HLB2, HLB3 pass through the central portion 60 of the mirror substrate 44.

In a second step the absorption for first, second and third heating light beams HLB1, HLB2, HLB3 has to be determined. Usually the heating light beams HLB1, HLB2, HLB3 produced by the three optical systems OS1, OS2 and OS3, respectively, will have the same center wavelength. In that case the coefficient of absorption of the material of the mirror substrate 44 will be equal for all heating light beams HLB1, HLB2, HLB3. Preferably the coefficient of absorption is measured for a particular mirror substrate 44, because even glass blanks of the same glass type may have slightly different compositions and thus slightly different coefficients of absorption for the heating light beams HLB1, HLB2, HLB3. If the mirror substrate is made of a glass or a glass ceramic such as ULE®, the coefficient of absorption often strongly depends on the titan concentration. Since this concentration may not be perfectly homogeneous in the blank, it may even be necessary to measure the coefficient of absorption for different ray paths and to store these measurement values so that they can be used during later computational steps.

In a next step a computing field is determined which is formed by an array of pixels, for example 65×65, 201×201 or 1001×1001 (square) pixels. An uneven number of pixels along the X and the Y direction is advantageous because then one pixel can be positioned computationally on an running through the center of the mirror substrate 44. The larger the number of pixels is, the more accurate will be the computation of the effect of the mirror substrate 44 on an optical wavefront. However, a larger number of pixels increases the computing time and may even raise stability issues such as increased sensibility against noise. Therefore a reasonable compromise has to be found with regard to the number of pixels in the pixel field.

In this pixel field the circular circumference of the mirror substrate 44 is computationally placed. At this computational rim surface the locations, where the individual heating light beams HLB1, HLB2, HLB3 enter the mirror substrate 44, and the propagation direction within the refractive optical 44 are determined.

Each heating light beam HLB1, HLB2, HLB3 is now considered as a manipulator which has an impact on the wavefront that passes through the central portion 60 of the mirror substrate 44. Then well-established optimization approaches may be used to determine the intensities of the individual heating light beams so as to obtain the desired effect on the optical wavefront. To this end the following procedure may be carried out for each heating light beam:

First, a basic intensity and a basic time over which this intensity is maintained are determined as a starting point.

Then it is determined which pixels of the pixel field are completely or partially affected by a particular heating light beam HLB1, HLB2, HLB3. For each pixel affected by the heating light beam HLB1, HLB2, HLB3 the residual intensity of the light beam HLB1, HLB2, HLB3 is computed. This residual intensity depends on the initial intensity, the coefficient of absorption of the mirror substrate 44 and the geometrical path length in it. As mentioned above, the coefficient of absorption may depend on the particular ray path that is associated with the heating light beam HLB1, HLB2, HLB3. On the basis of this residual intensity and the coefficient of absorption, the amount of energy which is dissipated as heat at the particular pixel is computed.

Now the temperature profile produced by the particular heating light beam HLB1, HLB2, HLB3 is computed on the basis of the amount of heat absorbed at the particular pixel. If the mirror substrate 44 is constantly cooled so as to obtain a constant average temperature, this cooling effect is also taken into account. Also time dependent effects (in particular heat conduction within the mirror substrate 44) are considered.

From this temperature profile a mirror surface deformation can be computed and assigned to the particular heating light beam HLB1, HLB2, HLB3. This is possible because the temperature changes necessary to affect the optical wavefront in the desired manner are so small that a linear model may be used for computing the deformation that is associated with the individual heating light beams HLB1, HLB2, HLB3. On the basis of this mirror surface deformation the effect of the heating light beam HLB1, HLB2, HLB3 on the optical wavefront can be computed using optical design programs. In this context it may be advantageous to increase the resolution of the pixel field computationally by interpolation.

After the effect of the individual heating light beams HLB1, HLB2, HLB3, which may be regarded as elementary manipulators, on an optical wavefront has been determined, an optimization problem has to be solved so that the interaction of all heating light beams HLB1, HLB2, HLB3 (and possibly of additional manipulators contained in the projection objective 26) achieves the desired correction of the wavefront error. Such optimization processes are known in the art. For example, singular value decomposition (SVD) or Tikhonov regularization may be used in this respect. Another approach based on Convex Programming is described in WO 2010/034674 A1.

A modified approach for controlling the intensities of the heating light beams may include the step of determining off-line the necessary intensities of the heating light beams HLB1, HLB2, HLB3 that are required for producing specific deformations. These specifies deformations may be described, for example, by certain Zernike polynomials which are often used to describe wavefront errors. For each such deformation the necessary intensities are determined in the manner explained above, for example using a singular value decomposition or a Tikhonov regularization.

During the operation of the projection exposure apparatus 10 the desired deformation is then decomposed into a linear superposition of the specific (Zernike) deformations for which the necessary intensities of the heating light beams HLB1, HLB2, HLB3 have been determined off-line. The resulting intensities for the individual heating light beams HLB1, HLB2, HLB3 are then simply a sum of the intensities that are associated with the specific deformations, but weighed by superposition coefficients. This usually results in a much quicker determination of the necessary intensities for the individual heating light beams HLB1, HLB2, HLB3.

IV. Alternative Embodiments

In the following various alternative embodiments will be described with reference to FIGS. 5 to 10.

Figure 5:
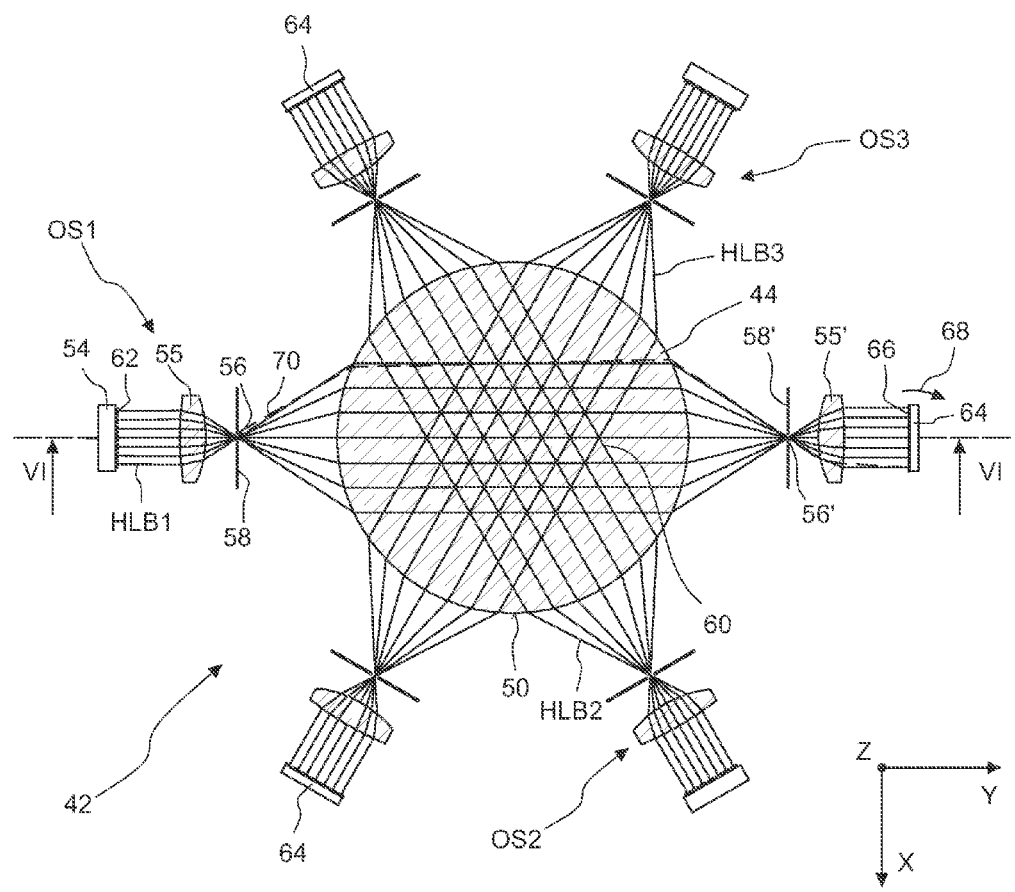
FIG. 5 is a schematic cross section in an XY plane through a correction device according to a second embodiment containing mirrors that reflect heating light back into the mirror substrate.
Figure 6:
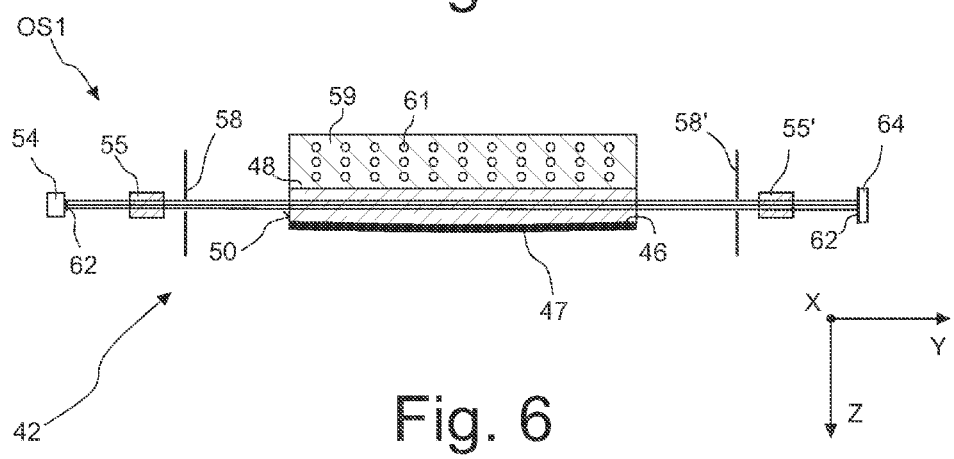
FIG. 6 is a schematic cross section through the correction device shown in FIG. 5 along line VI-VI.

FIGS. 5 and 6 are cross sections in an XZ and an YZ plane, respectively, through a correction device 42 according to a second embodiment. The same reference numerals are used for denoting identical or corresponding components.

Again the particular features of the correction device 42 will be only described with reference to the first optical system OS1; the other two optical systems OS2, OS3 have the same composition, but are arranged at different angular orientations in the XY plane.

In this second embodiment the light source 54 comprises a plurality of first light sources that are each configured to produce one of the first heating light beams HLB1. Each first light source is formed by an LED 62 to which a minute microlens (not shown) is attached that collimates the light emitted by the LED. The intensity of the individual first heating light beams HLB1 is controlled electronically by the control unit 52.

In contrast to the first embodiment shown in FIGS. 3 and 4, the first optical system OS1 produces first heating light beams HLB1 running parallel or nearly parallel after they have entered the mirror substrate 44. This results in a more regular arrangement of heating light beams HLB1 in the central portion 60 of the mirror substrate 44 which, in turn, facilitates an accurate production of the desired temperature distribution in this portion and makes it easier to collect the heating light beams HLB1 after they left the mirror substrate 44. The regular arrangement of the heating light beams HLB1 is mainly achieved by suitably adapting the refractive power of the cylindrical lens 55 and its distance from the mirror substrate 44 to the curvature of the rim surface 50 in the XY plane.

Last but not least the first optical system OS1 comprises a mirror 64 having a reflective surface 66 that reflects first heating light HL1 after it has traversed the mirror substrate 44. In other words, the fraction of the first heating light beams HLB1, which is not internally reflected at the rim surface 50, is refracted at this rim surface 50 and converges to a focal line 56' which is arranged in a front focal plane of a cylindrical lens 55'. Thus the first heating light beams HLB1 impinge, again parallel to each other, on the reflective surface 66. Consequently, the first heating light beams HLB1 take the same way when they return from the reflective surface 66 towards the light source 54. This has the advantage that less heating light is lost, which has a positive impact on the efficiency of the correction device 42.

In order to prevent that the first heating light beams HLB1 reflected from the mirror 64 enter the LEDs 62, the mirror 64 comprising the reflective surface 66 is slightly tilted, as it is indicated in FIG. 5 by an arrow 68. As a result of this tilted arrangement, the first heating light beams HLB1 take a slightly different route on their way back towards the light source 54. For one of the first heating light beams the route back towards the light source 54 is indicated with a broken line 70. It can be seen that the reflected heating light beam 70 does not pass exactly through the focal line 56, is therefore absorbed by the blind 58 and thus cannot enter one of the LEDs 62 of the light source 54.

In some cases the rim surface 50 of the mirror substrate 40 may not be easily accessible because it is obstructed by a mount which is required to precisely adjust the mirror substrate in the propagation path of the projection light PL.

Figure 7A:
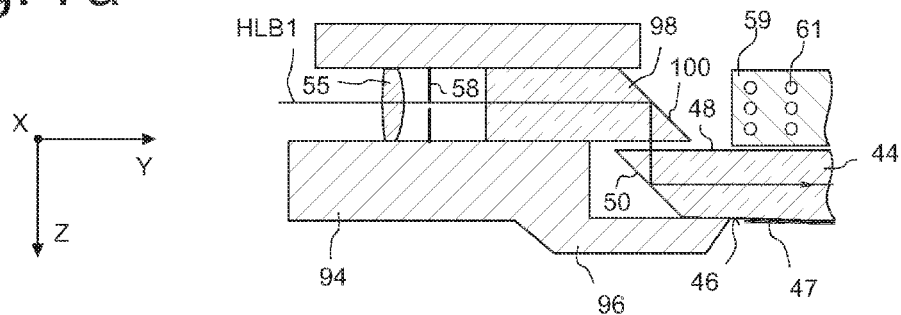
FIG. 7a is a partial and enlarged cross section in an XZ plane through a rim portion of the mirror substrate.

FIG. 7a shows a partial and enlarged cross section through a rim portion 50 of the mirror substrate 44. Here at least the portion of the rim surface 50, on which a heating light beam HLB1 impinges, forms an angle of 45° with respect to the back surface 48 of the mirror substrate 44.

A mount structure 94 has on one side a web 96 which supports the front surface 46 of the mirror substrate 44. At the opposite side of the mount structure 94 the cylindrical lens 55, the blind 58 and a light deviating element 98 formed by a prism are arranged. The beam deviating element 98 has a surface 100 which is inclined with respect to the optical axis OA. If the angle of inclination with respect to the optical axis OA also equals 45°, the first heating light beam HLB1 entering the beam deviating element 98 undergoes total internal reflection at the inclined surface 100 of the beam deviating element 98 so that the beam direction is deviated by 90°. The first heating light beam HLB1 then enters the mirror substrate 44 and undergoes again total internal reflection at its inclined rim surface 50. This results in a second deviation by 90° so that the first heating light beam HLB1 finally propagates again parallel to the back surface 48 through the mirror substrate 44.

Thus the plane, in which the heating light beam HLB1 propagates when it enters the light deviating element 98, is parallel to a plane in which it propagates through the mirror substrate 44. This makes it possible to arrange the cylindrical lens 55 and also the blind 58 completely above or completely below the rim surface 50 of the mirror substrate 44. In this manner any constraints regarding the available volume can be relaxed by distributing the various components of the optical systems OS1, OS2, OS3 in planes having different Z positions.

Figure 7B:
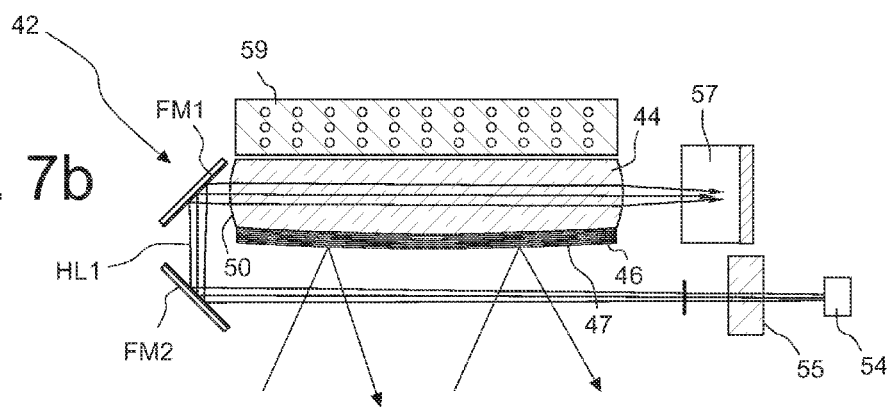
FIG. 7b is a schematic cross section similar to FIG. 4, but with an alternative heating light path.

In the alternative embodiment shown in FIG. 7b the path of the heating light HL1 is folded by two folding mirrors FM1, FM2 so that the heating light HL1 is guided over the front surface 46 of the mirror substrate 44, thereby crossing the path of the projection light that is reflected by the reflective coating 47. This may be advantageous if there is not sufficient space available immediately next to the rim surface 50 to accommodate the light source 54 and the cylindrical lens 55. In a still further alternative (not shown) the gap between the cooling body 59 and the mirror substrate 44 is enlarged to an extent such that the heating light HL1 can be guided not over the front surface 46 of the mirror substrate 44 as shown in FIG. 7b, but over its back surface 48.

Figure 8:
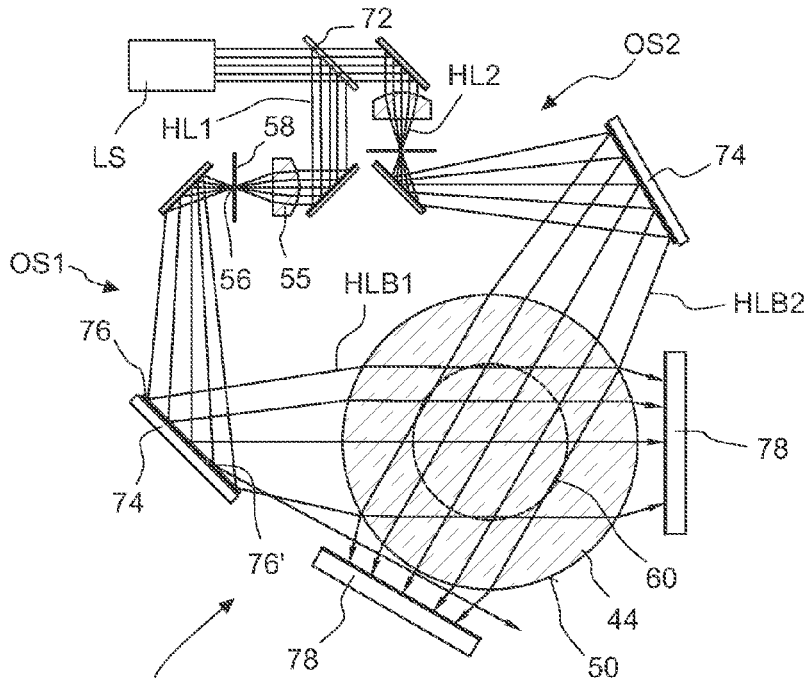
FIG. 8 is a schematic cross section in an XY plane through a correction device according to a third embodiment comprising a mirror array as a spatial light modulator.

FIG. 8 is a cross section through a correction device 42 according to a third embodiment in the first pupil plane 40. The same reference numerals are used for denoting identical or corresponding components.

The correction device 42 of the third embodiment comprises a single light source LS, which is configured to emit heating light, and a beam splitter 72 that splits the heating light into first heating light HL1 and second heating light HL2. The light source LS is realized in this embodiment as a laser which produces a single beam of heating light.

In order to be able to produce a plurality of first and second heating light beams HLB1, HLB2, HLB3 whose intensity can be varied individually, each optical system OS1, OS2 comprises a spatial light modulator 74 which is, in the embodiment shown, realized as an array of tiltable mirrors 76. Here each tiltable mirror 76 has an "on" state in which it directs the impinging heating light as an individual heating light beam HLB1, HLB2 or HLB3 towards the mirror substrate 44. If the mirror 76 is in an "off" state, as it is shown for one mirror 76' of the first optical system OS1, the impinging heating light is reflected such that it does not impinge on the mirror substrate 44.

Heating light beams HLB1, HLB2 that leave the mirror substrate 44 impinge on an absorber 78. Active or passive cooling of the absorber may be particularly important if the mirror substrate 44 absorbs only a small fraction of the heating light beams HLB1, HLB2, as this is the case, for example, for heating light having a wavelength of about 1450 nm in typical optical glasses.

Since the intensity of the heating light beams HLB1, HLB2 can be varied only between a maximum value and zero, the amount of energy which shall be absorbed by the mirror substrate 44 along the propagation path of the heating light beams has to be adjusted by the ratio of the times, during which a mirror 76 is in the "on" state, and the times during which this mirrors 76 is in the "off" state.

Figure 9:
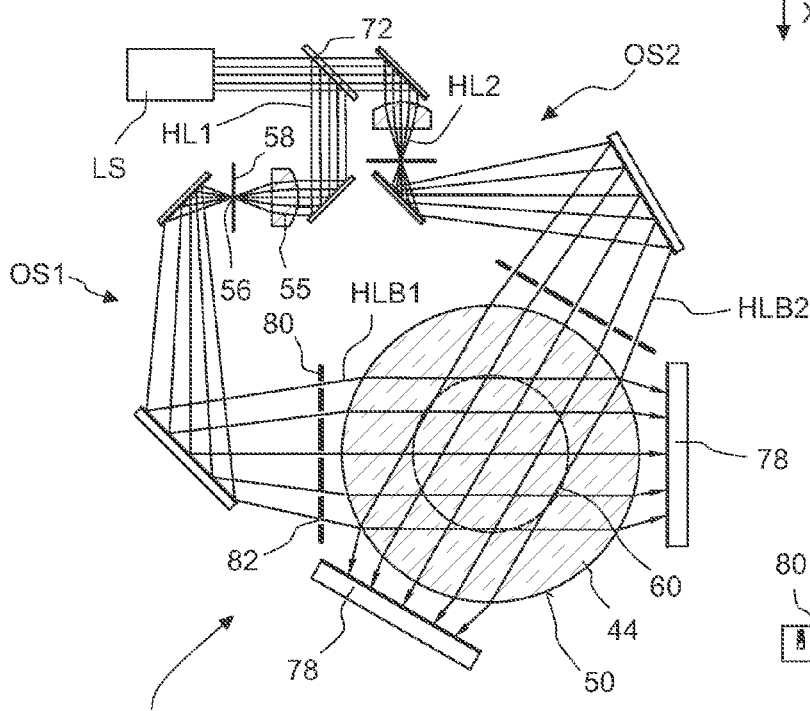
FIG. 9 is a schematic cross section in an XY plane through a correction device according to a fourth embodiment comprising a variable blind as a spatial light modulator.
Figure 10:
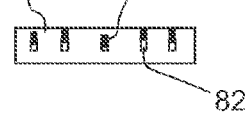
FIG. 10 is a front view on the variable blind contained in the correction device shown in FIG. 9.

FIG. 9 shows, in a cross section similar to FIG. 8, a correction device 42 according to a fourth embodiment. In this embodiment the spatial modulators are not formed by mirror arrays, but by variable blinds 80. As can also be seen in the front view of FIG. 10 on one of the blinds 80, each blind 80 has a plurality of apertures 82 whose size can be changed individually in response to the control signal supplied by the control unit 52. Each aperture 82 is associated with one of the heating light beams HLB1, HLB2.

To this end the variable blind 80 comprises shutter elements 84 that can be displaced, with the help of actuators (not shown) so that they partly or completely overlap the apertures 82.

As a matter of course, other types of a variable blinds are considered as well. For example, blinds may be used that contain LCD elements which can be switched between an "on" state, in which they are transparent for the heating light, and an "off" state, in which they are opaque for the heating light. In that case the intensities of the associated heating light beam can be adjusted, in the time average, by suitably setting the ratio of the times, during which an LCD element is in the "on" state, and the times during which this LCD element is in the "off" state.

As a matter of course, a third or even more optical systems may be provided in addition to the two optical systems OS1, OS2 shown in FIGS. 8 and 9.

V. Other Correction Devices

Figure 11:
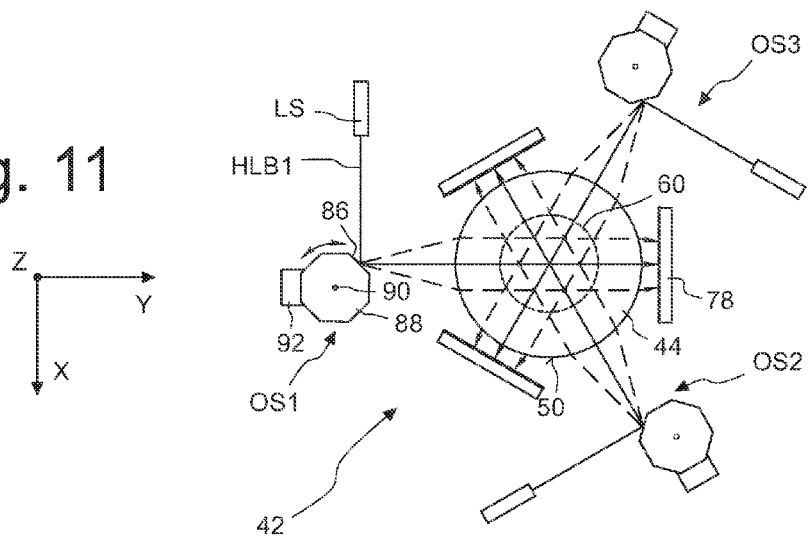
FIG. 11 is a top view of a correction device using a scanner set-up as spatial light modulator.

FIG. 11 shows an embodiment of a correction device 42 in which the spatial light modulator comprises a reflective surface 86 which is part of a polygon mirror 88. The polygon mirror 88 can be turned around a rotational axis 90 with the help of a drive 92 so that the spatial orientation of the reflective surface 86 can be continuously changed. If a first heating light beam HLB1, which may be emitted by a light source LS formed by a laser diode, for example, is directed on the reflective surface 86, it is possible to direct the first heating light beam HLB1 at different angles on different portions of the rim surface 50 of the mirror substrate 44. In this embodiment a plurality of heating light beams is thus not produced simultaneously, but subsequently using a kind of scanner set-up.

As in the previous embodiments, the other two optical systems OS2, OS3 have the same configuration as the optical system OS1.

Figure 12:
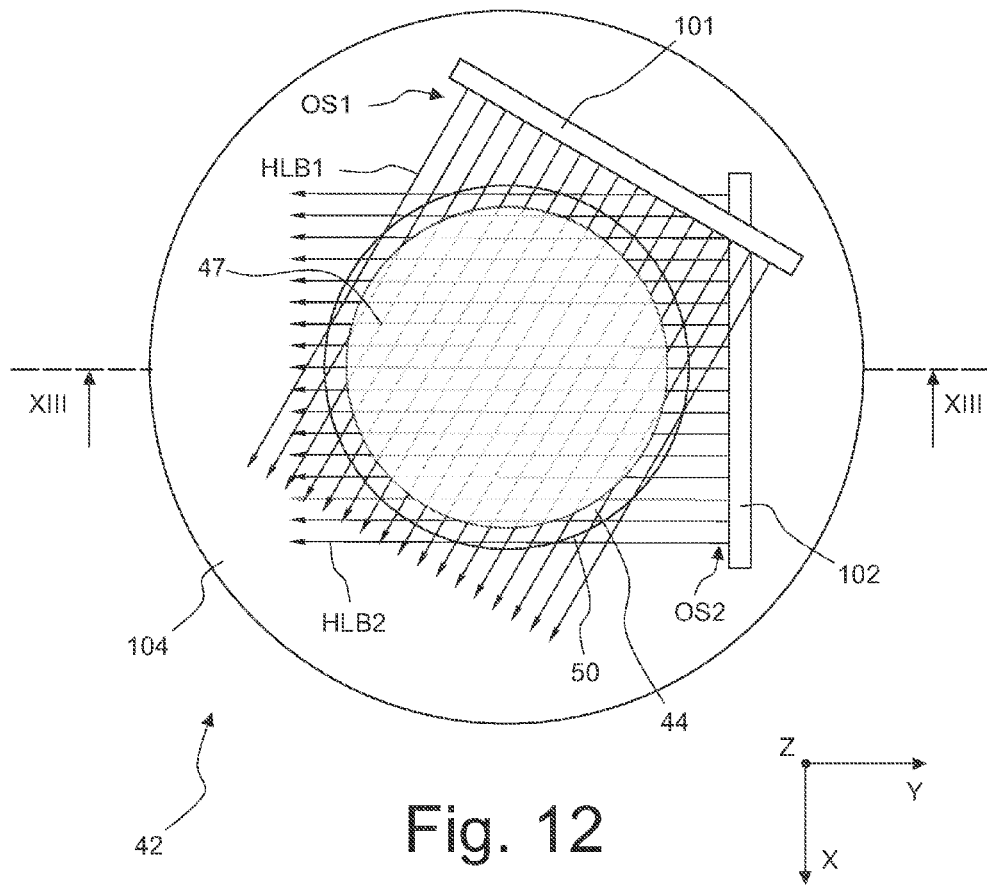
FIG. 12 is a schematic bottom view on a correction device in which a mirror substrate and LED bars are immersed in an optical adhesive.
Figure 13:
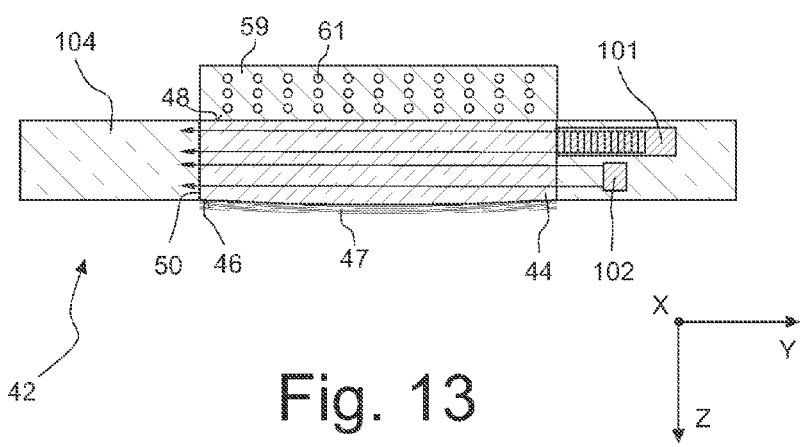
FIG. 13 is a schematic cross section through the correction device shown in FIG. 12 along line XIII-XIII.

FIGS. 12 and 13 schematically show a correction device 42 according to a further embodiment in a bottom view towards the reflective coating 47 and a cross section along line XIII-XIII, respectively. In this embodiment the first optical system OS1 essentially consists of a bar 101 comprising a plurality of LEDs and associated microlenses (not shown) that collimate the first heating light beams HLB1 emitted as parallel beams by the LEDs. A second bar 102 forming the second optical system OS2 has a similar construction, but is arranged in a different plane, as it becomes clear from the cross section shown in FIG. 13. If a third bar is provided, too, this may be arranged in a third plane which is arranged at a distance from the other two planes along the Z direction.

In order to suppress refraction at the rim surface 50 of the mirror substrate 44, the latter and the bars 101, 102 are immersed in an optical adhesive 104 having approximately the same refractive index as the mirror substrate 44. Such optical adhesive 104 are known in the art as such and may cure under the impact of UV light, for example. In the absence of a refractive index step at the rim surface 50, the heating light beams HLB1, HLB2 emitted by the bars 101, 102 traverse also the mirror substrate 44 in parallel, similar to the embodiment shown in FIGS. 5 and 6. In other embodiments the optical adhesive 104 is replaced by a liquid such as water.

FIG. 14 is a top view on a correction device according to an embodiment in which the mirror substrate 44 is not immersed in an optical adhesive. Bars 101, 102 containing LEDs are arranged such that the heating light beams HLB1, HLB2 emitted by the LEDs of the bars 101 and 102, respectively, overlap in the central portion 60 of the mirror substrate 44. The bars 101, 102 are curved so that the heating light beams HLB1, HLB2 are not emitted in parallel, but in a fan-like manner. The divergence of the fans is so large that, in spite of the converging effect produced by the rim surface 50 of the mirror substrate 44, each fan of heating light beams HLB1 or HLB2 completely covers the central portion 60. Nevertheless the bars 101, 102 are so short that they can be arranged in a single plane.

FIGS. 15 and 16 schematically show a correction device 42 according to a still further embodiment in a bottom view towards the reflective coating and a cross section along line XVI-XVI in the pupil plane 40, respectively. In this correction device 42 not only two, but 15 bars 101 to 115 are arranged around the mirror substrate 44 in the same plane. A very dense superposition of heating light beams is achieved in this manner in the central portion 60 of the mirror substrate 44.

In order to achieve also a converging effect along the Z direction, the rim surface 50 of the mirror substrate 44 of this embodiment has a curvature in planes perpendicular to the back surface 48. As can be seen best in the cross section of FIG. 16, divergent light emitted by the LEDs of the bars 101 to 115 is then collimated.

FIG. 17 is a top view on a correction device 42 according to an embodiment in which minute bars 101, 102 each containing a plurality of LEDs are so strongly curved that the fan of heating light beams covers a very large area of the mirror substrate 44. The bars 101, 102 are received in cylindrical recesses 119, 121 provided at the rim surface 50 of the mirror substrate 44. The diameter of the recesses 119, 121, is adapted such that the individual heating light beams HLB1, HLB2 emitted by the LEDs enter the mirror substrate 44 perpendicularly so that no refraction and minimum reflection occurs.

The recesses 119, 121, provided at the rim surface 50 may be replaced by bores or another type of hole that accommodates the circular arrangement of LEDs, as it is shown in the bottom view of FIG. 18. The bars 101, 102 arranged in bore 120, 122 produce smaller fans of heating light beams, but these fans are still sufficient to completely cover the central portion 60 of the mirror substrate 44 on which also projection light impinges during operation of the projection exposure apparatus 10.

Figure 19:
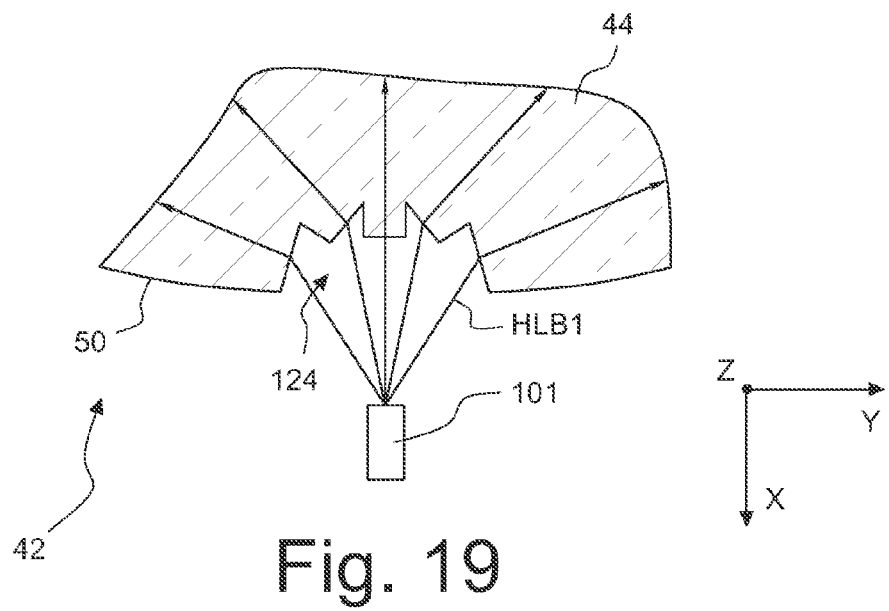
FIG. 19 shows a detail of a portion of the rim portion of the mirror substrate containing a Fresnel lens.

FIG. 19 shows a detail of a mirror substrate 44 according to a still further embodiment. Similar to the embodiment shown in FIG. 17, a light source 101 producing a fan of individual heating light beams HLB1 is arranged very closely to the rim surface 50 of the mirror substrate 44. Here the recess formed at the rim surface 50 does not have a cylindrical shape, but forms, in a YZ plane, a diverging Fresnel lens. Thus the original fan of heating light beams HLB1 emitted by the light source 101 is expanded by the Fresnel lens 124 into a fan having a much wider angular width.

Figure 20:
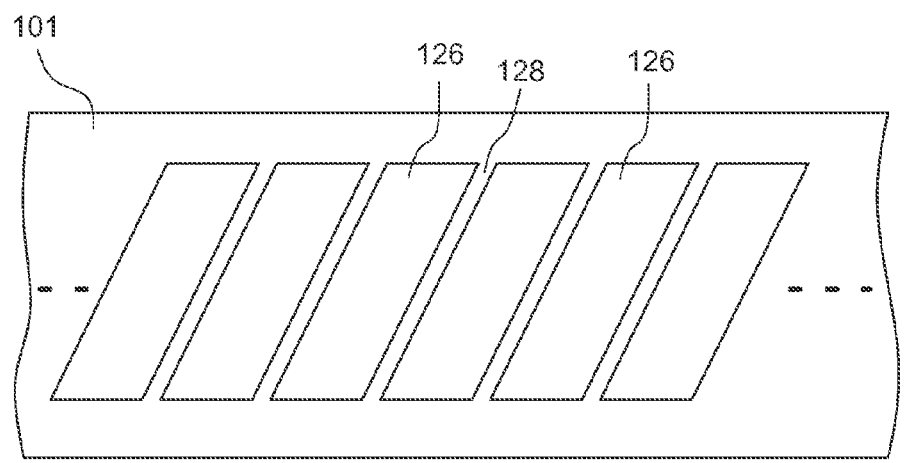
FIG. 20 is a schematic front view of a bar containing a plurality of laser diodes.

FIG. 20 is a schematic front view of a bar 101 containing laser diodes. The exit windows 126 of the laser diodes (or blinds arranged in front the exit windows) have the shape of parallelograms. Gaps 128 between adjacent exit windows 126 are dimensioned such that there are no coordinates along the circumferential direction (in FIG. 20 coinciding with the X direction) at which no heating light emitted by the laser diodes impinges on the mirror substrate 44. This results in a more homogenous heating of the mirror substrate 44 as compared to the case in which rectangular exit windows were arranged side by side separated by gaps that are also rectangular.

Figure 21:
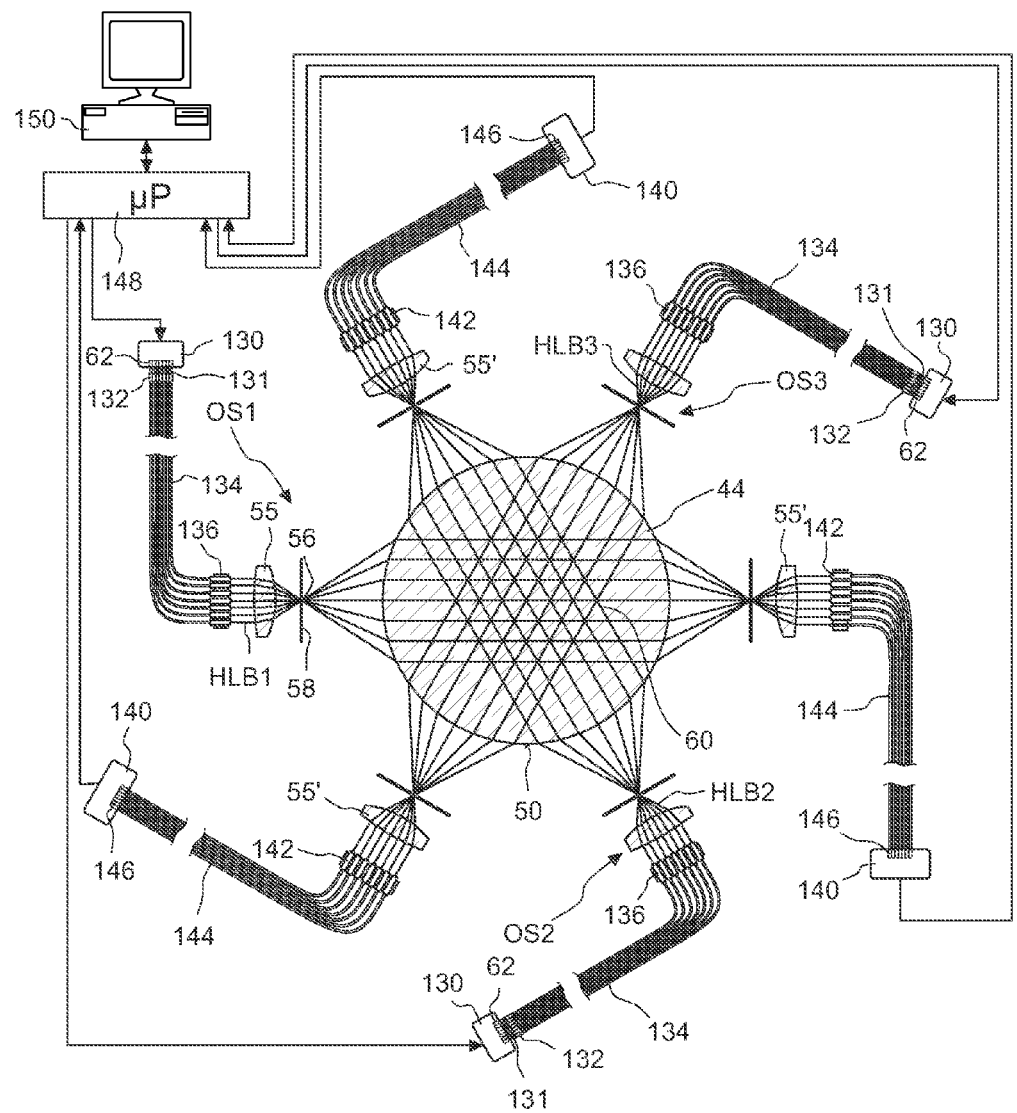
FIG. 21 is a schematic cross section in an XY plane through a correction device according to another embodiment in which optical fibers are used to convey heating light from a remote heating light source to the mirror substrate.

FIG. 21 is a schematic cross section in an XY plane through a correction device 42 according to another embodiment. This embodiment differs from the embodiment shown in FIGS. 5 and 6 mainly in that the LEDs 62 producing the individual heating light beams HLB1, HLB2, HLB3 are not arranged inside the projection objective 26, but are combined in LED packages 130 which are arranged at some place outside the projection objective 26. The LED packages comprise optical output fibers 131 and coupling optics (not shown) that couple the heating light beams HLB1, HLB2, HLB3 emitted from the LEDs 62 into the optical output fibers 131. Each LED package further comprises a releasable multi-fiber connector 132 that connects the bundle of optical output fibers 131 to a bundle of optical input fibers 134. In the latter the heating light beams HLB1, HLB2, HLB3 are guided to output optics 136 which directs the heating light beams HLB1, HLB2, HLB3 to the focusing lens 55 of the respective optical system OS1, OS2, OS3.

The arrangement of the LED packages 130 outside the projection objective 26 has the advantage that a replacement of the LEDs 62 is greatly facilitated. If one or more LEDs 62 malfunctions or completely ceases to emit light at the end of their lifetime, the complete LED package 130 may be simply disconnected from the bundle of optical input fibers 131 and replaced by a new package using the multi-fiber connector 132. Since the LED packages 130 are arranged outside the projection objective 26, this can be accomplished without dismounting any parts of the projection objective 26.

Another advantage is that any power dissipation involved with the generation of the heating light beams occurs outside the projection objective 26. This helps to keep the projection objective 26 at a constant temperature.

In the embodiment shown in FIG. 21, the irradiances, or at least irradiance variations, of the heating light beams HLB1, HLB2, HLB3 after they have left the mirror substrate 44, are measured by detectors 140 which are also arranged outside the projection objective 26. To this end the heating light beams HLB1, HLB2, HLB3 are coupled, after leaving the mirror substrate 44 and traversing the lenses 55', by coupling optics 144 into optical fibers 142. The latter individually guide the heating light beams HLB1, HLB2, HLB3 to photodiodes 146 or other light sensitive elements that are arranged inside the detectors 140. Since also the detectors 140 are arranged outside the projection objective, also the heat which is dissipated at the photodiodes 146 cannot influence the heat balance of the projection objective 26.

The measurement of the irradiance of the heating light beams HLB1, HLB2, HLB3 makes it possible to monitor the proper function of the LEDs 62. Furthermore, it is possible to establish a closed loop control in which the LEDs 62 inside the LED packages 130 are controlled depending on the irradiances measured by the detectors 140. To this end the LED packages 130 and the detectors 140 are connected by electrical signal lines to a control unit 148 which is connected to an overall system control 150 that controls the overall function of the projection exposure apparatus 10. Any variation of the irradiances detected by the detectors 140 will have an impact on the manipulator that is associated with the respective heating light beam, as it has been explained above in section III. This, in turn, will usually require an adjustment of the irradiance of the respective heating light beam.

If only an (unknown) fraction of the heating light is coupled into the optical fibers 142 and eventually impinges on the photodiodes 146, the electrical signals produced by the photodiodes 146 indicate, strictly speaking, not the irradiance of the heating light beams when leaving the mirror substrate 44, but only a change of this irradiance. However, this suffices to monitor the proper function of the LEDs 62 and/or to perform their closed loop control.

VI. Reduction of Thermal Expansion Effects

Heat induced image errors in the projection objective 26 are mainly caused by deformations of the mirror substrate 44 as a result of thermal expansion. Usually the mirror substrate 44 is made of a glass or another material that has, at the operating temperature of the apparatus 10, a zero coefficient of thermal expansion. Then temperature changes do not lead to a deformation of the mirror substrate 44 if the temperature changes are kept within certain limits.

Figure 22:
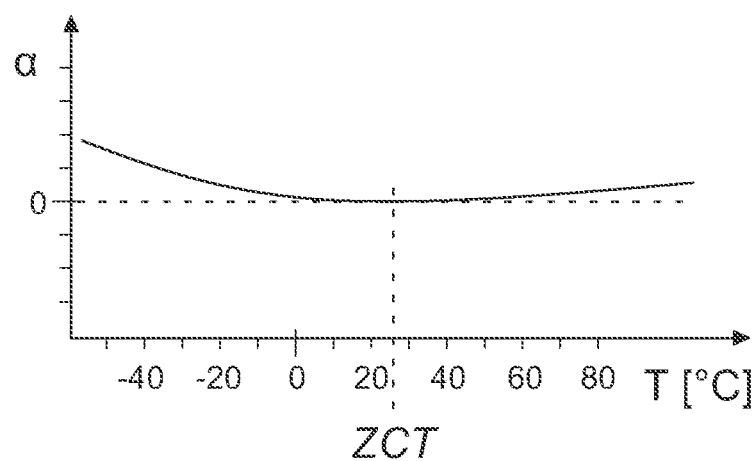
FIG. 22 is a graph illustrating the dependency of the coefficient of thermal expansion on the temperature for a glass blank from which a mirror substrate is made.

As it is known in the art, the coefficient of thermal expansion a depends on the temperature T. FIG. 22 shows a graph that illustrates this dependency for a ULE® glass blank supplied by Corning that may be used as material for the mirror substrate 44. It can be seen that at a certain temperature (and sometimes at two or more different temperatures), which will be referred to in the following as zero crossing temperature ZCT, the coefficient of thermal expansion a equals zero. In this particular glass blank the coefficient of thermal expansion a is very small, but distinct from zero, around this ZCT in a range between approximately 15° C. and 45° C. For other glasses such as Zerodur® the temperature dependency may be different, but there is often at least one zero crossing temperature at which the coefficient of thermal expansion equals zero.

The zero crossing temperature ZCT can be adjusted during the manufacturing of the glass blank to a certain extent. Thus it is possible to provide glass blanks having a ZTC that is approximately equal to the operating temperature of the mirror. Then temperature changes, as they are inevitable during operation of the apparatus 10, do not result in a thermal contraction or expansion of the mirror substrate 44, and thus the shape of the optical surface that supports the reflective coating 47 does not change, either, or at least these changes are kept very small.

However, it has turned out that the glass blanks that are used for manufacturing the mirror substrate 44 are usually not perfectly homogenous. As a result, the refractive index and also the zero crossing temperature ZCT vary—albeit to a very small extent—over the volume of the glass blank.

Figure 23:
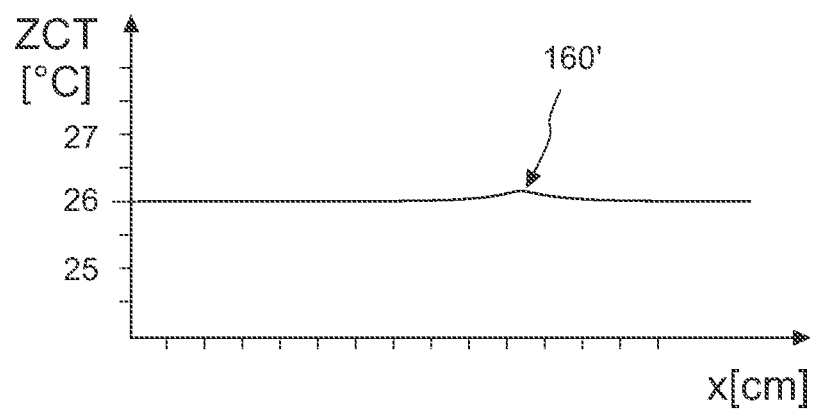
FIG. 23 is a graph illustrating the position dependency of the zero crossing temperature (ZCT) for this glass blank.

FIG. 23 shows a graph in which the position dependency of the zero crossing temperature ZCT is exemplarily illustrated. Here the abscissa denotes a Cartesian coordinate if one moves through a glass blank along a certain line. It can be seen that the zero crossing temperature ZCT is almost constant, but at a certain position indicated at 160' it varies slightly.

Figure 24:
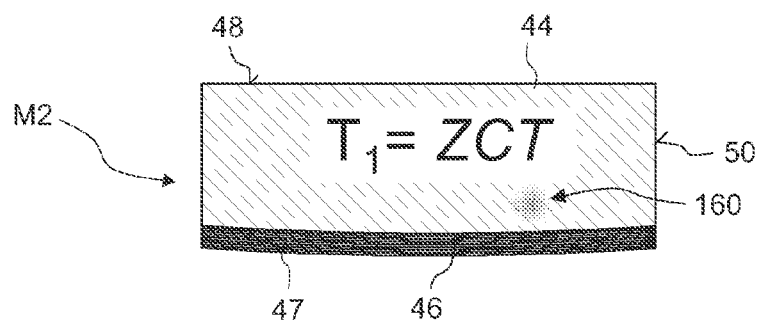
FIG. 24 shows a mirror comprising a mirror substrate having an inhomogeneous ZCT distribution.
Figure 25:
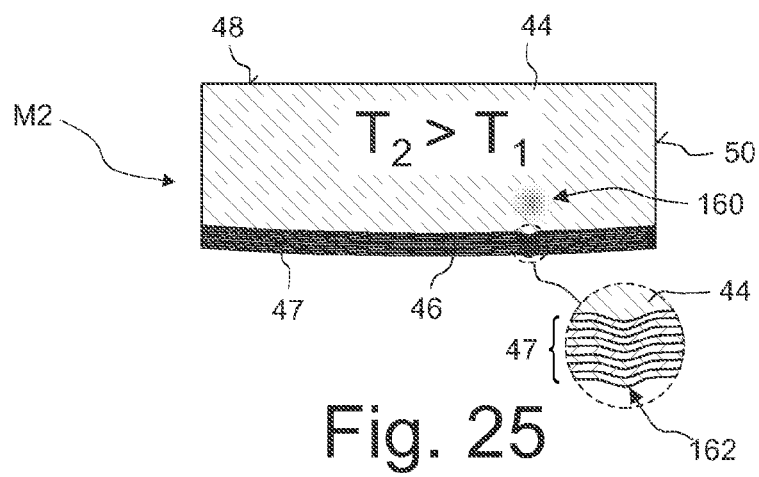
FIG. 25 illustrates a deformation of the optical surface that is caused by a temperature change in the mirror substrate shown in FIG. 24.

FIGS. 24 and 25 illustrate the effects that are associated with an inhomogeneous distribution of the zero crossing temperature across the volume of the substrate 44. In FIG. 24 it is assumed that the entire substrate 44 is kept at a temperature $T_1$ which is equal to the zero crossing temperature ZCT of the greatest part of the substrate 44. However, in a portion 160, which corresponds to the region 160' indicated in FIG. 23, the mirror substrate 44 has a higher zero crossing temperature ZCT. Consequently, this portion 160 undergoes a thermal expansion if the temperature increases from $T_1$ to $T_2 > T_1$, as this is shown in FIG. 25. It can be seen that the thermal expansion of the portion 160 leads to a surface deformation 162 which alters the optical properties of the mirror M2 and causes a heat induced image error.

In accordance with the present invention, such surface deformations 162 are prevented by producing, with the help of heating light directed towards the rim surface 50 of the mirror substrate 44, a temperature distribution so that at each point in the mirror substrate 44 the zero crossing temperature ZCT is obtained. Then at least small temperature changes do not cause any thermal deformation of the mirror substrate 44.

Figure 26:
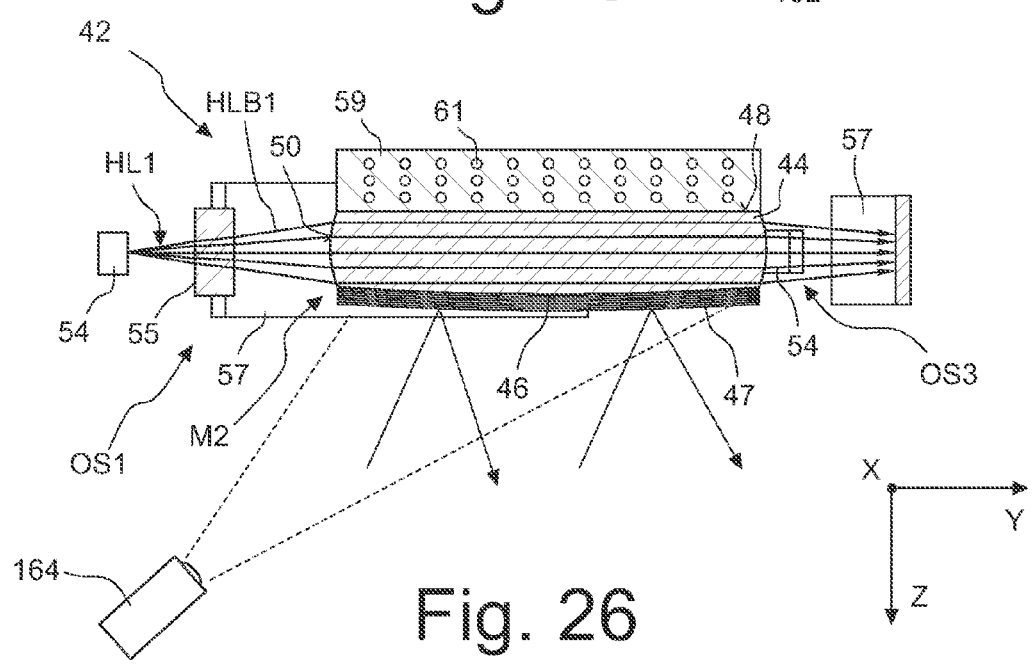
FIG. 26 is a cross section through a correction device that maintains a specified temperature distribution inside the mirror substrate during operation of the projection exposure apparatus.

FIG. 26 shows an embodiment of a correction device 42 which is similar to the correction device shown in FIGS. 3 and 4. In contrast to that embodiment, however, the heating light HL1 here emerges from the heating light source 54 with a larger divergence. Thus the heating light source 54 produces again fans of heating light beams HLB1 as shown in FIG. 3, but the planes in which the heating light beams HLB1 pass through the mirror substrate 44 are separated by larger distances. Therefore heating light beams HLB1 extend through almost the entire volume of the mirror substrate 44.

Similar to the embodiment shown inn FIGS. 3 and 4, there are two further optical systems OS2 and OS3 that produce similar fans of heating light beams HLB1, HLB2 in five different planes.

With the help of the optical systems OS1, OS2, OS3 it is thus possible to produce almost any arbitrary temperature distribution in the mirror substrate 44, at it has been explained further above with reference to FIGS. 3 and 4.

In order to produce a temperature distribution that is equal to the distribution of the zero crossing temperature ZCT, it is necessary to measure the latter beforehand. Since the distribution of the zero crossing temperature ZCT is directly related to the distribution of the refractive index for a certain type of material, it suffices to measure the three dimensional refractive index distribution in the mirror substrate 44.

One way to accomplish this is to immerse the glass blank, from which the mirror substrate 44 will be manufactured, in a liquid which has approximately the same refractive index as the glass blank. Then the refractive index distribution can be measured using the principles of computer tomography. This means that the optical path length differences are measured by comparing the phase of an optical light ray passing through the glass blank along a certain direction and comparing it with the phase of a reference light ray that does not pass through the glass blank. Each optical path length difference corresponds to the integral over the refractive index that the respective light ray has experienced when passing through the blank. By applying the Radon transformation it is then possible to deduce from the measured path length differences the three dimensional refractive index distribution in the glass blank (cf. F. Natterer, The mathematics of computerized tomography, Siam, 2001).

From this refractive index distribution the distribution of the zero crossing temperature ZCT is derived on the basis of a calibration measurement which is performed for the specific type of glass from which the glass blank is made.

With the help of the optical system OS1, OS2, OS3 a temperature distribution is then produced inside the mirror substrate 44 that equals the distribution of the zero crossing temperature ZCT, as this has been explained above. This temperature distribution is preferably maintained during the entire operation of the apparatus 10. Then mirror changes of the temperature inside the mirror substrate 44 will not lead to its deformation.

Maintaining a certain 3D temperature distribution will usually involve a frequent measurement of the actual temperature distribution inside the mirror substrate 44. To this end a heat camera 164 measures the temperature distribution on the reflective coating 47. From this temperature distribution it is possible to derive, on the basis of heat transport equations, the 3D temperature distribution inside the mirror substrate M2. Then the intensity of the individual heating light beams HLB1, HLB2 and HLB3 is adjusted in a close loop control scheme so that the original temperature distribution in the mirror substrate 44, which equals the ZCT distribution, is maintained.

Figure 27:
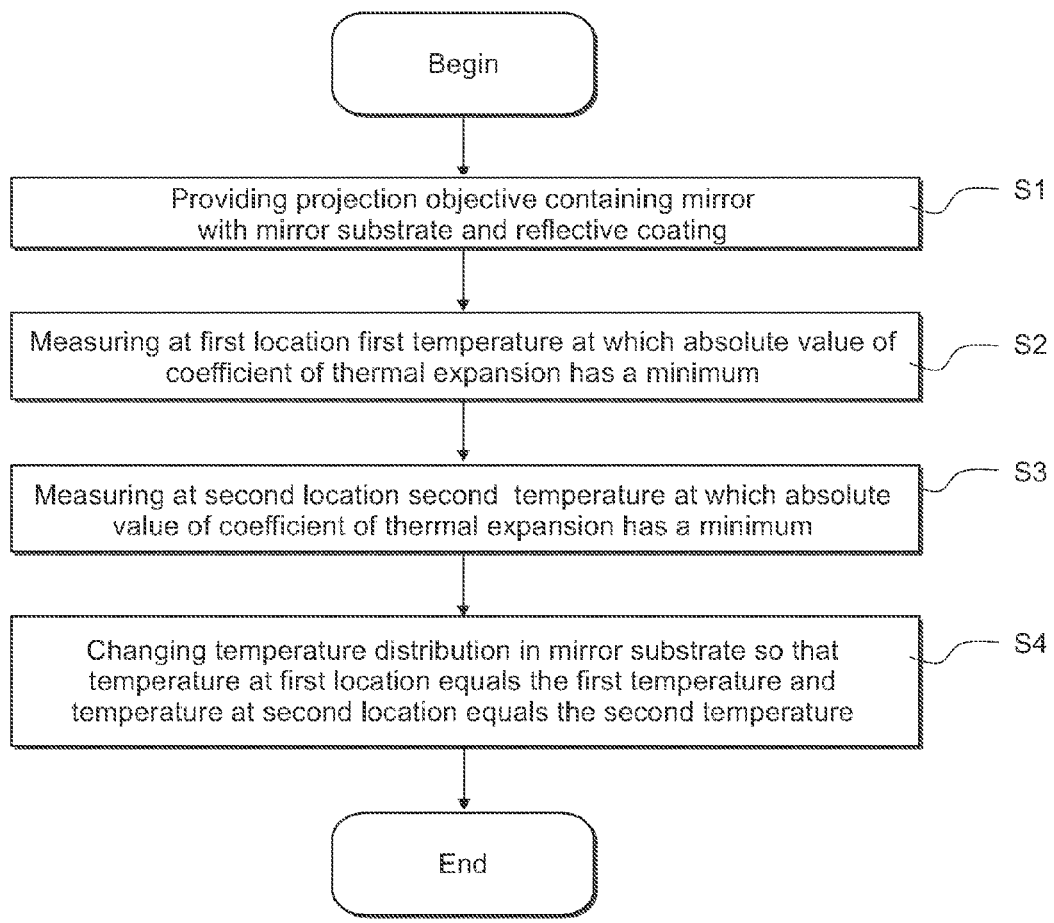
FIG. 27 is a flow diagram illustrating important steps that are carried out to prevent heat induced image errors according to an embodiment of the invention.

In the following important method steps of the invention according to this aspect will be explained with reference to the flow diagram shown in FIG. 27.

In a first step S1 a projection objective containing a mirror with a mirror substrate and a reflective coating is provided.

In a second step S2 a first temperature, at which the absolute value of the coefficient of thermal expansion has a minimum, is measured at a first location of the mirror substrate.

In a third step S3 a second temperature, at which the absolute value of the coefficient of thermal expansion has a minimum and which will generally be different from the first temperature, is measured at a second location of the mirror substrate that is different from the first location.

Then, in a forth step S4, a temperature distribution in the mirror substrate is changed so that the temperature at the first location equals the first temperature and the temperature at the second location equals the second temperature.

VII. Summary of Important Aspects of the Invention

The following sentences summarize some other important aspects of the present invention:

1. An objective of a microlithographic apparatus, wherein the projection objective (26) is configured to image a mask (16) on an image plane using projection light, and wherein the projection objective (26) comprises a wavefront correction device (42) comprising
   a) a mirror that has a mirror substrate having a front surface (46), a back surface (48) and a circumferential rim surface (50) extending between the front surface and the back surface, and a reflective coating (44) which is supported by the front surface of the mirror substrate, wherein the reflective coating is configured to reflect impinging projection light,
   b) a light source (101, 102) which is configured to emit heating light such that it impinges on the rim surface, wherein a volume confined by the mirror substrate (44) and the light source (101, 102) is filled by an optical medium (104) that is a liquid, a solid or a mixture of a liquid and a solid.

2. The projection objective of sentence 1, wherein an refractive index ratio of the optical medium (104) and the mirror substrate (44) is at 22° C. between 0.80 and 1.1.

3. A projection objective of a microlithographic apparatus, wherein the projection objective (26) is configured to image a mask (16) on an image plane using projection light, and wherein the projection objective (26) comprises a wavefront correction device (42) comprising
   a) a mirror that has a mirror substrate having a front surface (46), a back surface (48) and a circumferential rim surface (50) extending between the front surface and the back surface, and a reflective coating (44) which is supported by the front surface of the mirror substrate, wherein the reflective coating is configured to reflect impinging projection light,
   b) a light source which is configured to emit heating light such that it impinges on the rim surface, wherein a portion of the rim surface (50), at which the heating light impinges, is formed as a Fresnel lens (124) having a refractive power at least along one direction.

4. A projection objective of a microlithographic apparatus, wherein the projection objective (26) is configured to image a mask (16) on an image plane using projection light, and wherein the projection objective (26) comprises a wavefront correction device (42) comprising
   a) a mirror that has a mirror substrate having a front surface (46), a back surface (48) and a circumferential rim surface (50) extending between the front surface and the back surface, and a reflective coating (44) which is supported by the front surface of the mirror substrate, wherein the reflective coating is configured to reflect impinging projection light,
   b) a light source which is configured to emit heating light, wherein the mirror substrate has a bore (120, 122), a hole or a recess in which the light source is arranged such that the heating light enters the mirror substrate perpendicularly.

5. The projection objective of sentence 4, wherein the light source (101, 102) is configured to emit heating light beams over an angular range of at least 40°.

6. A projection objective of a microlithographic apparatus, wherein the projection objective (26) is configured to image a mask (16) on an image plane using projection light, and wherein the projection objective (26) comprises a wavefront correction device (42) comprising
   a) a mirror that has a mirror substrate having a front surface (46), a back surface (48) and a circumferential rim surface (50) extending between the front surface and the back surface, and a reflective coating (44) which is supported by the front surface of the mirror substrate, wherein the reflective coating is configured to reflect impinging projection light,
   b) a light source which is configured to emit heating light, and
   c) a spatial light modulator, wherein the spatial light modulator (74; 80; 88) is configured to direct the heating light produced by the light source towards different portions of the rim surface.

7. The projection objective of sentence 6, wherein the spatial light modulator comprises a reflective surface (86) and a driver (92) which is configured to change the spatial orientation of the reflective surface.

8. A projection objective of a microlithographic apparatus, wherein the projection objective (26) is configured to image a mask (16) on an image plane using projection light, and wherein the projection objective (26) comprises a wavefront correction device (42) comprising
   a) a mirror that has a mirror substrate having a front surface (46), a back surface (48) and a circumferential rim surface (50) extending between the front surface and the back surface, and a reflective coating (44) which is supported by the front surface of the mirror substrate, wherein the reflective coating is configured to reflect impinging projection light, b) a light source (54) which is configured to emit heating light (HLB1, HLB2, HLB3),
c) an optical system (OS1, OS2) that directs the heating light towards a portion of the rim surface (50), and
d) a reflective surface (66) which reflects at least 70% of heating light, which has traversed the mirror substrate (44), so that it traverses the mirror substrate (44) again.

9. The projection objective of sentence 8, wherein the reflective surface (66) is arranged outside the mirror substrate.

10. A method of operating a microlithographic apparatus, comprising the following steps:
  a) providing a projection objective containing a mirror (M2) that has a mirror substrate (44) and a reflective coating (47) applied on the mirror substrate, wherein the reflective coating is configured to reflect impinging projection light;
  b) measuring at a first location of the mirror substrate a first temperature at which the absolute value of the coefficient of thermal expansion has a minimum;
  c) measuring at a second location of the mirror substrate a second temperature at which the absolute value of the coefficient of thermal expansion has a minimum, wherein the first location is different from the second location;
  d) changing a temperature distribution in the mirror substrate (44) so that the temperature at the first location equals the first temperature and the temperature at the second location equals the second temperature.

11. The method of sentence 10, wherein a mask is illuminated with projection light after step d).

12. The method of sentence 10 or 11, wherein the temperature distribution is changed in step d) by illuminating the mirror substrate with heating light.

13. The method of sentence 12, wherein the heating light has a center wavelength that is different from a center wavelength of the projection light.

14. The method of sentence 12 or 13, wherein the mirror substrate has a front surface (46) that supports the reflective coating, a back surface (48) and a circumferential rim surface (50) extending between the front surface and the back surface, wherein the heating light is directed in step d) on the circumferential rim surface of the mirror substrate.

15. The method of sentence 14, wherein a first set of heating light beams is directed on the rim surface that extend through the mirror substrate in a first plane, and wherein a second set of heating light beams is directed on the rim surface that extend through the mirror substrate in a second plane that is different from the first plane.

16. The method of any of sentences 10 to 15, wherein the temperature distribution in the mirror substrate is measured between steps c) and d).

17. The method of sentence 16, wherein the temperature distribution is measured using at least one heat camera (164).

The invention claimed is:

1. An apparatus, comprising:
an illumination system;
a projection objective; and
a wavefront correction device, comprising:
  a mirror, comprising:
    a mirror substrate having a front surface, a back surface and a circumferential rim surface extending between the front surface of the mirror substrate and the back surface of the mirror substrate; and
    a reflective coating supported by the front surface of the mirror substrate, the reflective coating configured to reflect projection light that impinges on the reflective coating;
  a first optical system configured to direct first heating light to a first portion of the rim surface so that at least a portion of the first heating light enters the mirror substrate, the first optical system comprising a focusing optical element configured to focus the first heating light in a focal area so that the first heating light that emerges from the focal area impinges on the first portion of the rim surface;
  a second optical system is configured to direct second heating light to a second portion of the rim surface so that at least a portion of the second heating light enters the mirror substrate; and
  an absorber configured so that, during use of the wavefront correction device, all first and second heating light beams impinge on the absorber after leaving the mirror substrate,
wherein:
  the second portion of the rim surface is different from the first portion of the rim surface;
  the wavefront correction device is configured so that, during use of the wavefront correction device, partial absorption of the first heating light and the second heating light causes a temperature distribution in the mirror substrate that deforms the mirror to at least partially correct a wavefront error; and
  the apparatus is a microlithographic projection exposure apparatus.

2. The apparatus of claim 1, wherein the first optical system comprises a blind having an aperture, and the focal area is positioned in the aperture.

3. The apparatus of claim 1, wherein the wavefront correction device is configured so that, during use of the wavefront correction device, after the first heating light enters the mirror substrate, the first heating light propagates through the mirror substrate as collimated light.

4. The apparatus of claim 1, wherein the rim surface comprises a cylindrical surface or a conical surface.

5. The apparatus of claim 1, wherein the first portion of the rim surface is curved in a plane intersecting the first portion of the rim surface and containing a symmetry axis of the mirror.

6. The apparatus of claim 1, wherein the wavefront correction device further comprises:
  a light source configured to emit heating light; and
  a beam splitter configured so split the heating light emitted by the light source into the first heating light and the second heating light.

7. The apparatus of claim 1, wherein:
  the first optical system comprises a single first light source configured to produce the first heating light; and
  the second optical system comprises a single second light source configured to produce the second heating light.

8. The apparatus of claim 1, wherein the first optical system comprises a spatial light modulator configured to change an intensity of the first heating light in a spatially resolved manner to provide a plurality of first heating light beams, and the spatial light modulator is configured to individually change an intensity of each of the first heating light beams.

9. The apparatus of claim 8, wherein the spatial light modulator comprises an array of beam deviating elements, and each beam deviating element is configured to deflect impinging first heating light by a deflection angle that is variable in response to a control signal.

10. The apparatus of claim 8, wherein the spatial light modulator comprises a blind comprising a plurality of apertures, each aperture a size and/or transmissivity that is changeable in response to a control signal.

11. The apparatus of claim 1, wherein the first optical system comprises a reflective surface configured to reflect at least 70% of heating light which, during use of the wavefront correction device, traverses the mirror substrate so that, upon reflecting at the reflective surface, the heating light again traverses the mirror substrate.

12. The apparatus of claim 11, wherein the reflective surface is configured so that a direction of the reflected heating light differs from a direction of the light impinging on the reflective surface.

13. The apparatus of claim 12, wherein the direction of the reflected light differs from the direction of the impinging light by an angle between 180.05° and 185°.

14. The apparatus of claim 1, wherein, in at least one plane, each of the focusing element and the mirror substrate both has an optical effect of positive lenses.

15. The apparatus of claim 1, wherein the focal area is a focal point, or the focal area is a focal line.

16. The apparatus of claim 1, wherein the projection light has a center wavelength between 5 nm and 50 nm.

17. The apparatus of claim 1, wherein:
the first heating light comprises first heating light beams;
the first optical system comprises first light detectors configured so that, during use of the wavefront correction device, the first light detectors measure irradiance variations of the first heating light beams after the first heating light beams leave the mirror substrate;
the second heating light comprises second heating light beams; and
the second optical system comprises second light detectors configured so that, during use of the wavefront correction device, the second light detectors measure irradiance variations of the second heating light beams after the second light beams leave the mirror substrate.

18. The apparatus of claim 17, further comprising a control unit configured so that, during use of the wavefront correction device, the control unit controls the first and second optical systems based on the irradiance variations measured by the first and second light detectors.

19. An apparatus, comprising:
an illumination system;
a projection objective; and
a wavefront correction device, comprising:
a mirror, comprising:
a mirror substrate having a front surface, a back surface and a circumferential rim surface extending between the front surface of the mirror substrate and the back surface of the mirror substrate; and
a reflective coating supported by the front surface of the mirror substrate, the reflective coating configured to reflect projection light that impinges on the reflective coating;
a first optical system configured to direct first heating light to a first portion of the rim surface so that at least a portion of the first heating light enters the mirror substrate, the first optical system comprising a focusing optical element configured to focus the first heating light in a focal area so that the first heating light that emerges from the focal area impinges on the first portion of the rim surface; and
a second optical system is configured to direct second heating light to a second portion of the rim surface so that at least a portion of the second heating light enters the mirror substrate;
wherein:
the second portion of the rim surface is different from the first portion of the rim surface;
the wavefront correction device is configured so that, during use of the wavefront correction device, partial absorption of the first heating light and the second heating light causes a temperature distribution in the mirror substrate that deforms the mirror to at least partially correct a wavefront error;
the first heating light comprises first heating light beams;
the first optical system comprises first light detectors configured so that, during use of the wavefront correction device, the first light detectors measure irradiance variations of the first heating light beams after the first heating light beams leave the mirror substrate;
the second heating light comprises second heating light beams;
the second optical system comprises second light detectors configured so that, during use of the wavefront correction device, the second light detectors measure irradiance variations of the second heating light beams after the second light beams leave the mirror substrate; and
the apparatus is a microlithographic projection exposure apparatus.

20. An apparatus, comprising:
an illumination system;
a projection objective; and
a wavefront correction device, comprising:
a mirror, comprising:
a mirror substrate having a front surface, a back surface and a circumferential rim surface extending between the front surface of the mirror substrate and the back surface of the mirror substrate; and
a reflective coating supported by the front surface of the mirror substrate, the reflective coating configured to reflect projection light that impinges on the reflective coating;
a first optical system configured to direct first heating light to a first portion of the rim surface so that at least a portion of the first heating light enters the mirror substrate, the first optical system comprising a focusing optical element configured to focus the first heating light in a focal area so that the first heating light that emerges from the focal area impinges on the first portion of the rim surface; and
a second optical system is configured to direct second heating light to a second portion of the rim surface so that at least a portion of the second heating light enters the mirror substrate;
wherein:
the second portion of the rim surface is different from the first portion of the rim surface;
the wavefront correction device is configured so that, during use of the wavefront correction device, partial absorption of the first heating light and the second heating light causes a temperature distribution in the mirror substrate that deforms the mirror to at least partially correct a wavefront error;
the first optical system comprises a spatial light modulator configured to change an intensity of the first heating light in a spatially resolved manner to provide a plurality of first heating light beams;

the spatial light modulator is configured to individually change an intensity of each of the first heating light beams; and the apparatus is a microlithographic projection exposure apparatus.

21. The apparatus of claim 20, wherein the spatial light modulator comprises an array of beam deviating elements, and each beam deviating element is configured to deflect impinging first heating light by a deflection angle that is variable in response to a control signal.

22. The apparatus of claim 20, wherein the spatial light modulator comprises a blind comprising a plurality of apertures, each aperture a size and/or transmissivity that is changeable in response to a control signal.

* * * * *

UNITED STATES PATENT AND TRADEMARK OFFICE
CERTIFICATE OF CORRECTION

| | |
|---|---|
| PATENT NO. | : 9,348,234 B2 |
| APPLICATION NO. | : 14/845574 |
| DATED | : May 24, 2016 |
| INVENTOR(S) | : Boris Bittner et al. |

It is certified that error appears in the above-identified patent and that said Letters Patent is hereby corrected as shown below:

In the specification,

Col. 27, line 4, delete "mirror" and insert -- minor --.

Signed and Sealed this
Second Day of August, 2016

Michelle K. Lee
*Director of the United States Patent and Trademark Office*